(12) United States Patent
Hirasawa et al.

(10) Patent No.: US 10,181,553 B2
(45) Date of Patent: Jan. 15, 2019

(54) SEMICONDUCTOR DEVICE AND METHOD FOR PRODUCING THE SAME

(71) Applicants: CITIZEN ELECTRONICS CO., LTD., Yamanashi-ken (JP); CITIZEN WATCH CO., LTD., Tokyo (JP)

(72) Inventors: Koki Hirasawa, Yamanashi-ken (JP); Kazuki Matsumura, Yamanashi-ken (JP); Takashi Iino, Yamanashi-ken (JP)

(73) Assignees: CITIZEN ELECTRONICS CO., LTD, Yamanashi-Ken (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 15/501,577

(22) PCT Filed: Jul. 30, 2015

(86) PCT No.: PCT/JP2015/071607
§ 371 (c)(1),
(2) Date: Feb. 3, 2017

(87) PCT Pub. No.: WO2016/021476
PCT Pub. Date: Feb. 11, 2016

(65) Prior Publication Data
US 2018/0175267 A1 Jun. 21, 2018

(30) Foreign Application Priority Data
Aug. 5, 2014 (JP) .................................. 2014-159333

(51) Int. Cl.
*H01L 21/00* (2006.01)
*H01L 33/62* (2010.01)
(Continued)

(52) U.S. Cl.
CPC .............. *H01L 33/62* (2013.01); *H01L 23/12* (2013.01); *H01L 24/16* (2013.01); *H01L 24/97* (2013.01);
(Continued)

(58) Field of Classification Search
CPC ....... H01L 33/62; H01L 33/486; H01L 24/97; H01L 24/16; H01L 33/647; H01L 33/60;
(Continued)

(56) References Cited

U.S. PATENT DOCUMENTS

| 5,888,883 A | 3/1999 | Sasaki et al. |
| 6,184,109 B1 | 2/2001 | Sasaki et al. |

(Continued)

FOREIGN PATENT DOCUMENTS

| CN | 201054360 | 4/2008 |
| CN | 202111151 | 1/2012 |

(Continued)

OTHER PUBLICATIONS

Extended European Search Report dated Apr. 19, 2017 in corresponding European Application No. 15830533.4.
(Continued)

*Primary Examiner* — Vu A Vu
(74) *Attorney, Agent, or Firm* — Wenderoth, Lind & Ponack, L.L.P.

(57) ABSTRACT

A semiconductor device directly joins electrodes of a semiconductor element to electrodes of a metal substrate and has good yield, connection reliability, good mass productivity, and superior heat dissipation efficiency. A method for producing the semiconductor device that directly joins the electrodes of the metal substrate to the electrodes of the semiconductor element includes forming an electrode separating groove in an element mounting position on a main surface of the metal substrate at a predetermined depth. The (Continued)

semiconductor element is mounted to extend over the electrode separating groove. The metal substrate is ground from a surface reverse to the main surface of the metal substrate up to a position reaching the electrode separating groove.

18 Claims, 18 Drawing Sheets

(51) Int. Cl.

| | |
|---|---|
| H01L 23/12 | (2006.01) |
| H01L 23/00 | (2006.01) |
| H01L 33/48 | (2010.01) |
| H01L 33/50 | (2010.01) |
| H01L 33/56 | (2010.01) |
| H01L 33/60 | (2010.01) |
| H01L 33/64 | (2010.01) |

(52) U.S. Cl.
CPC .......... *H01L 33/486* (2013.01); *H01L 33/502* (2013.01); *H01L 33/56* (2013.01); *H01L 33/60* (2013.01); *H01L 33/647* (2013.01); *H01L 2224/16245* (2013.01); *H01L 2224/95001* (2013.01); *H01L 2924/12041* (2013.01); *H01L 2924/181* (2013.01); *H01L 2924/3511* (2013.01); *H01L 2924/37001* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01)

(58) Field of Classification Search
CPC .................. H01L 33/56; H01L 33/502; H01L 2933/0041; H01L 2224/16245; H01L 2924/12041; H01L 2924/3511; H01L 2924/37001; H01L 2933/0066
USPC ............................................... 438/27; 257/88
See application file for complete search history.

(56) References Cited

U.S. PATENT DOCUMENTS

| | | | |
|---|---|---|---|
| 6,294,439 B1 | 9/2001 | Sasaki et al. | |
| 6,599,768 B1* | 7/2003 | Chen | H01L 24/97 |
| | | | 362/249.01 |
| 8,324,082 B1 | 12/2012 | Liu et al. | |
| 2013/0049061 A1 | 2/2013 | Takeda et al. | |
| 2013/0178006 A1* | 7/2013 | Kim | H01L 21/78 |
| | | | 438/33 |
| 2013/0187188 A1* | 7/2013 | Sasaoka | H05K 1/0313 |
| | | | 257/99 |
| 2013/0221509 A1 | 8/2013 | Oda et al. | |
| 2013/0343067 A1 | 12/2013 | Okada | |
| 2014/0295646 A1* | 10/2014 | Shinoda | H01L 21/6836 |
| | | | 438/464 |
| 2014/0349424 A1 | 11/2014 | Oda et al. | |
| 2015/0084177 A1 | 3/2015 | Oda et al. | |
| 2015/0349227 A1 | 12/2015 | Oda et al. | |
| 2015/0372210 A1 | 12/2015 | Oda et al. | |
| 2016/0079504 A1 | 3/2016 | Oda et al. | |
| 2016/0293817 A1 | 10/2016 | Oda et al. | |
| 2017/0092830 A1 | 3/2017 | Oda et al. | |

FOREIGN PATENT DOCUMENTS

| | | |
|---|---|---|
| CN | 202917534 | 5/2013 |
| CN | 103190008 | 7/2013 |
| CN | 103392242 | 11/2013 |
| DE | 103 05 021 | 4/2004 |
| JP | 07-106285 | 1/1995 |
| JP | 07-106285 | 4/1995 |
| JP | 11-40520 | 2/1999 |
| JP | 2011-025347 | 2/2011 |
| JP | 2012-204392 | 10/2012 |
| JP | 2013-157357 | 8/2013 |

OTHER PUBLICATIONS

International Search Report dated Aug. 25, 2015 in International (PCT) Application No. PCT/JP2015/071607 with English translation.

Written Opinion of the International Searching Authority dated Aug. 25, 2015 in International (PCT) Application No. PCT/JP2015/071607 with English translation.

Office Action dated Jun. 4, 2016 in corresponding Chinese Patent Application No. 201580041468.8, with English-language translation.

Chinese Office Action dated Nov. 23, 2018 in corresponding Chinese Patent Application No. 201580041468.8 with English translation.

\* cited by examiner

[Fig. 1]
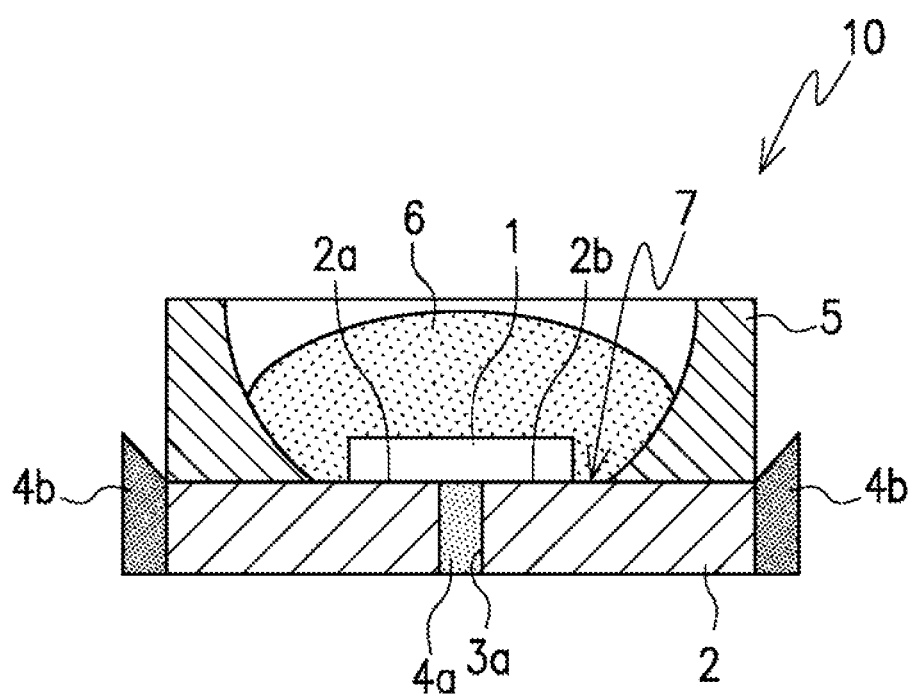

[Fig. 2]
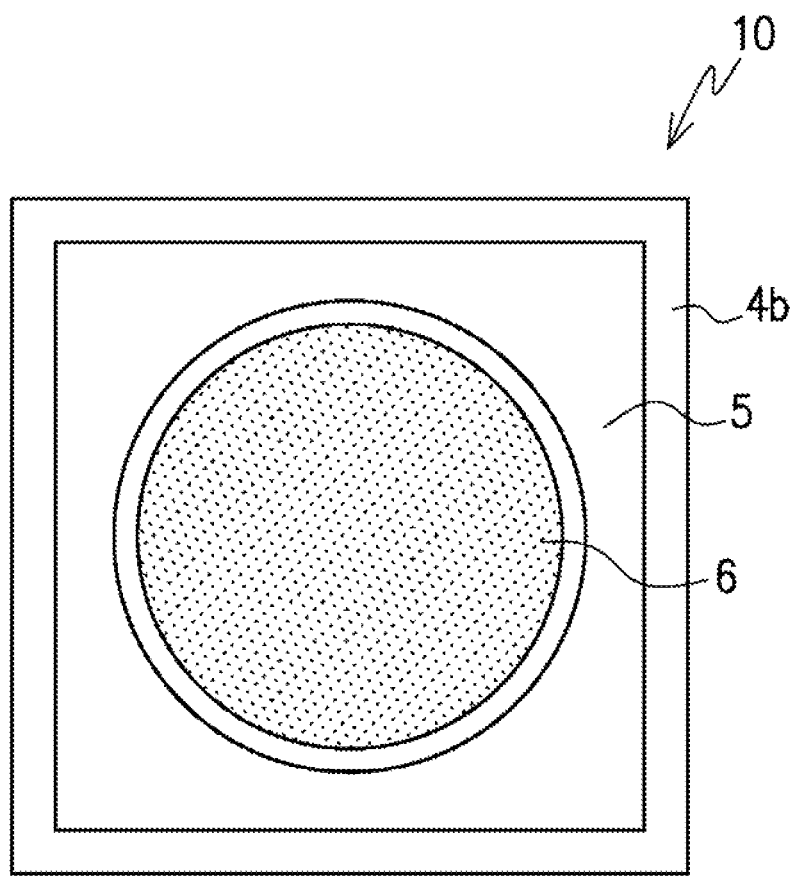

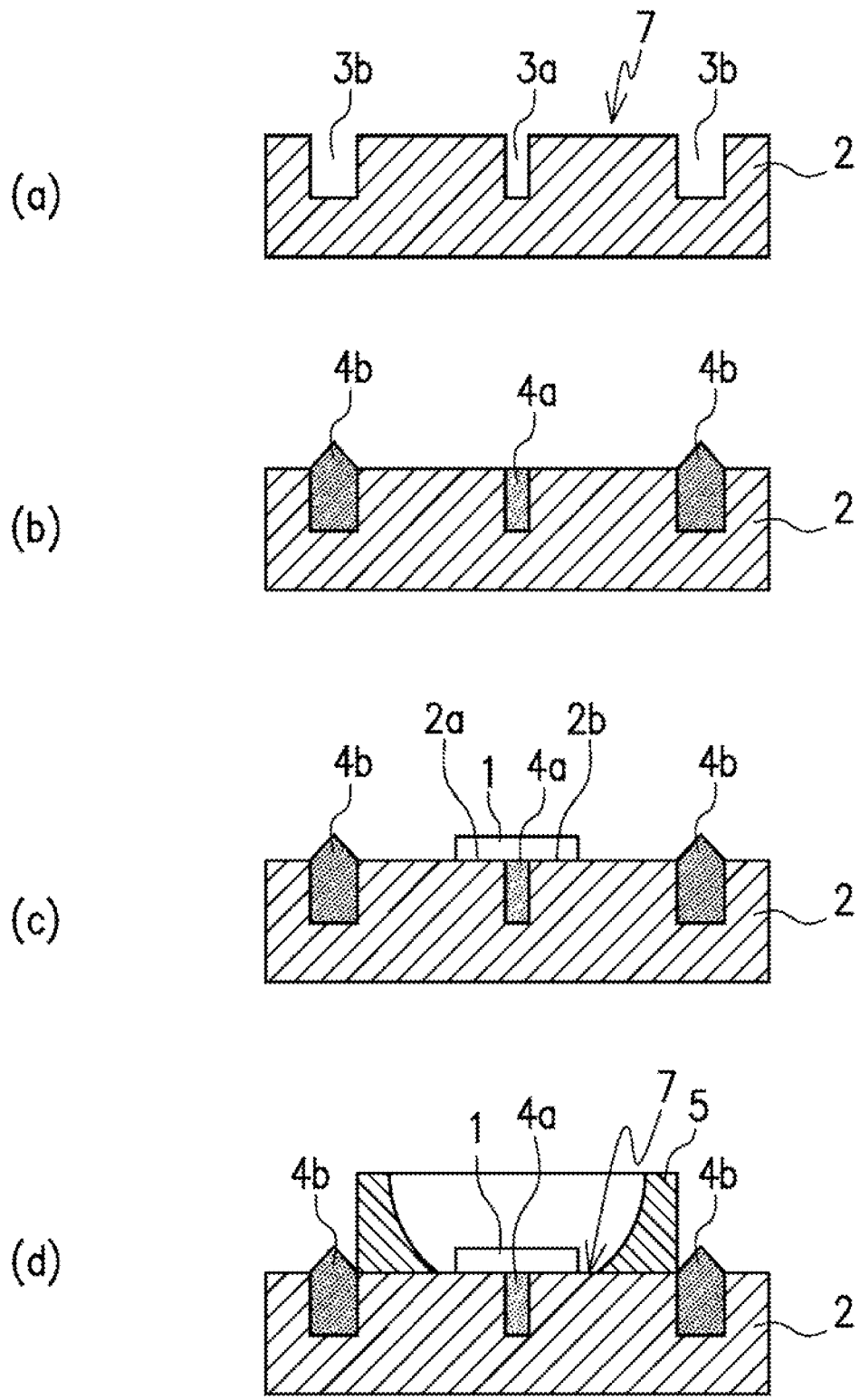
[Fig. 3]

[Fig. 4]
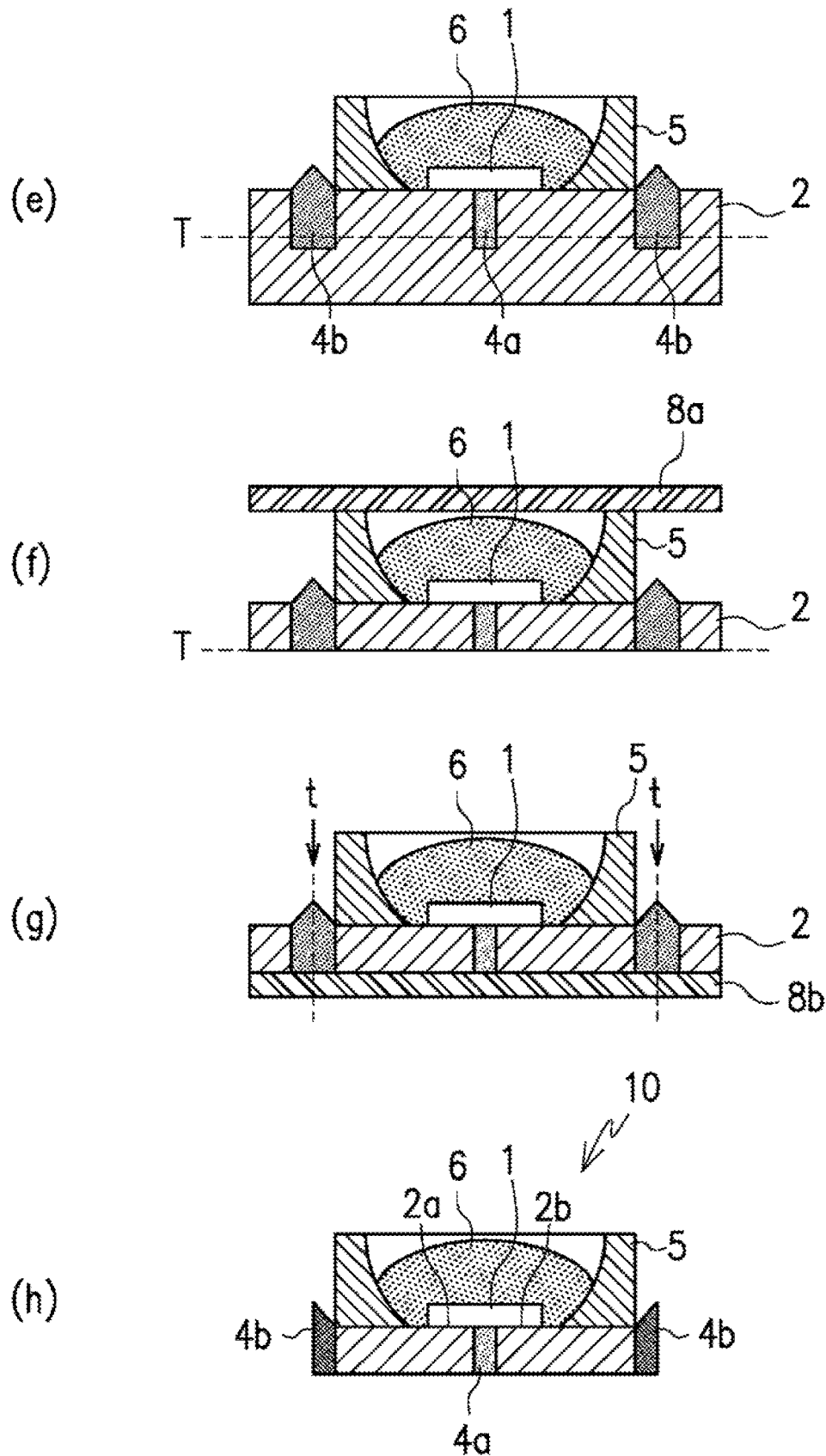

[Fig. 5]
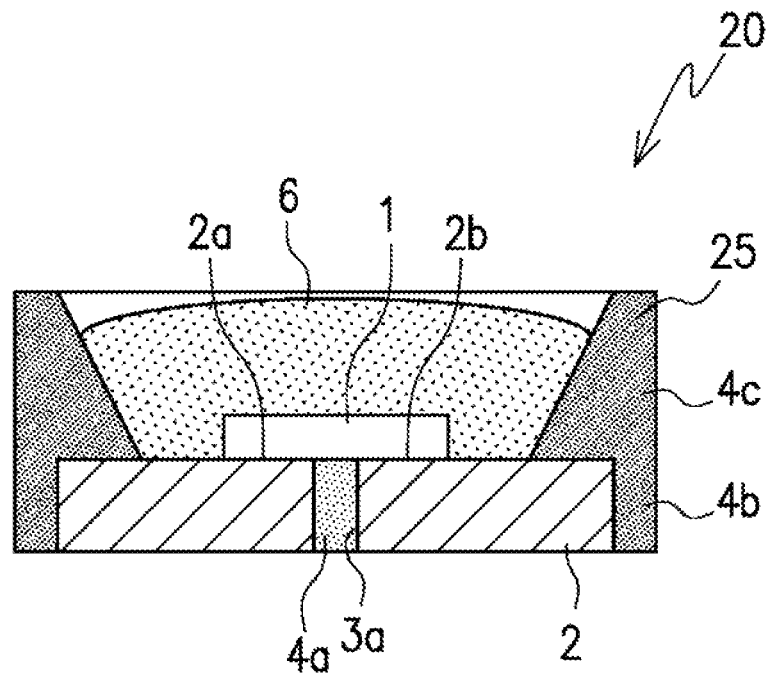
[Fig. 6]
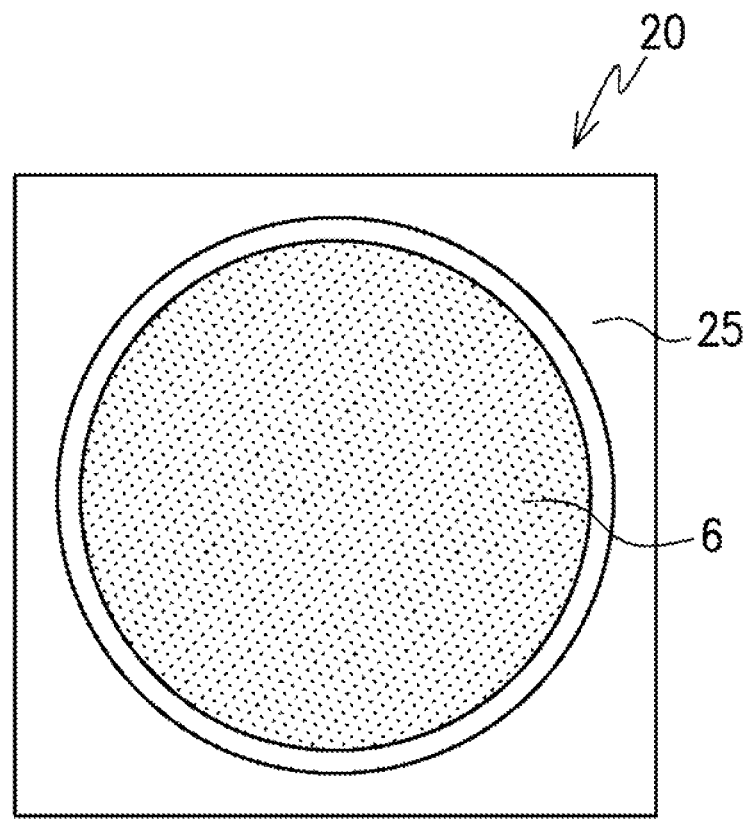

[Fig. 7]
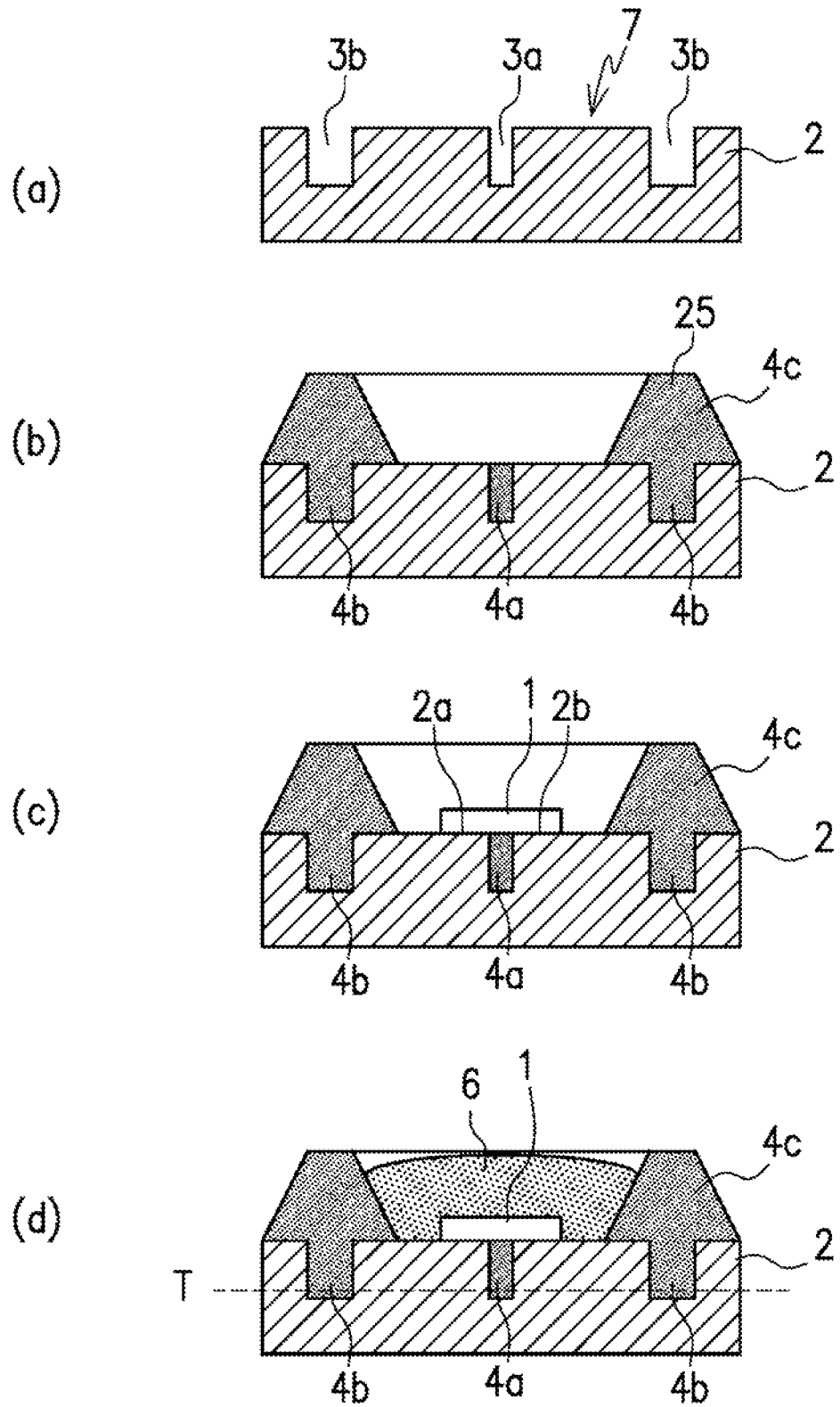

[Fig. 8]
(e)
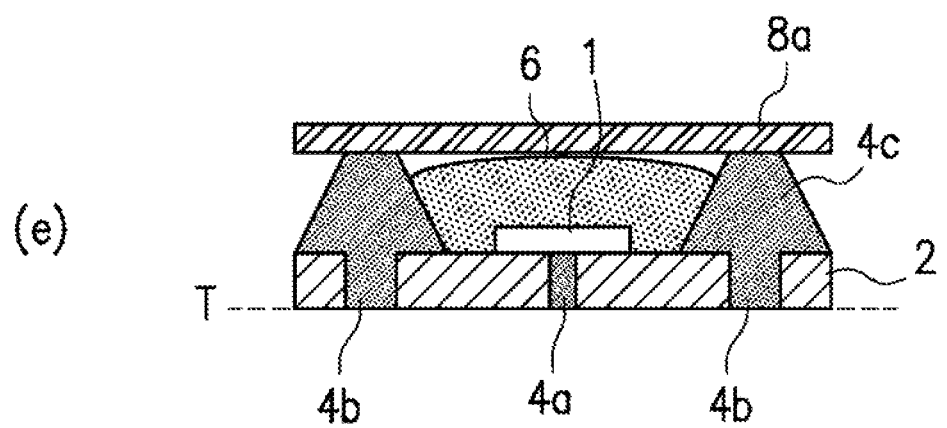
(f)
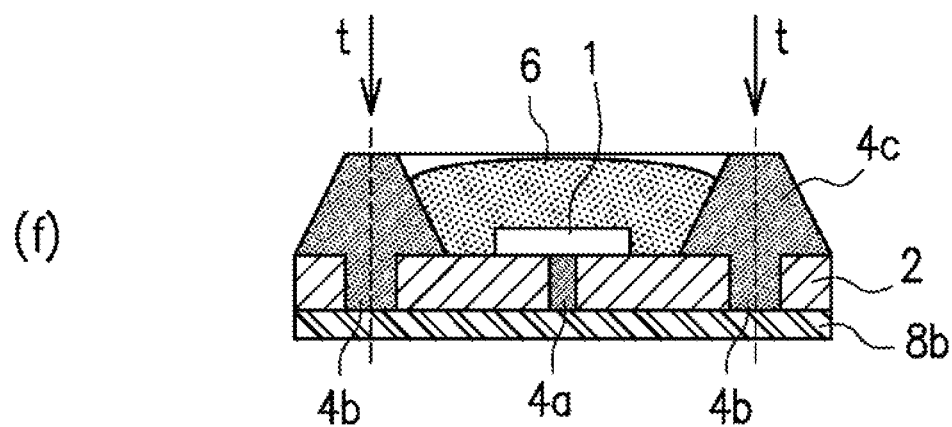
(g)
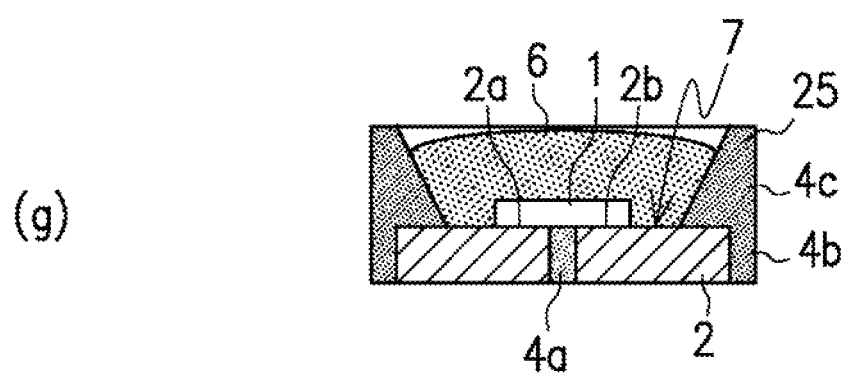

[Fig. 9]
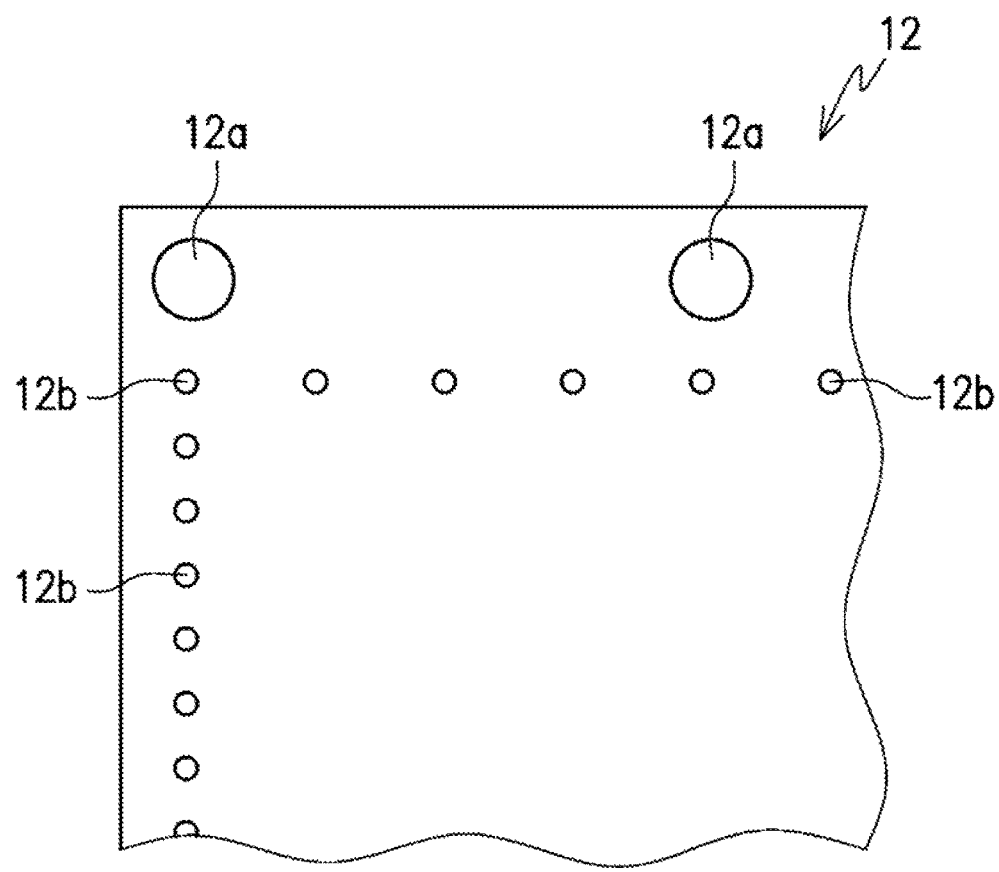

[Fig. 10]
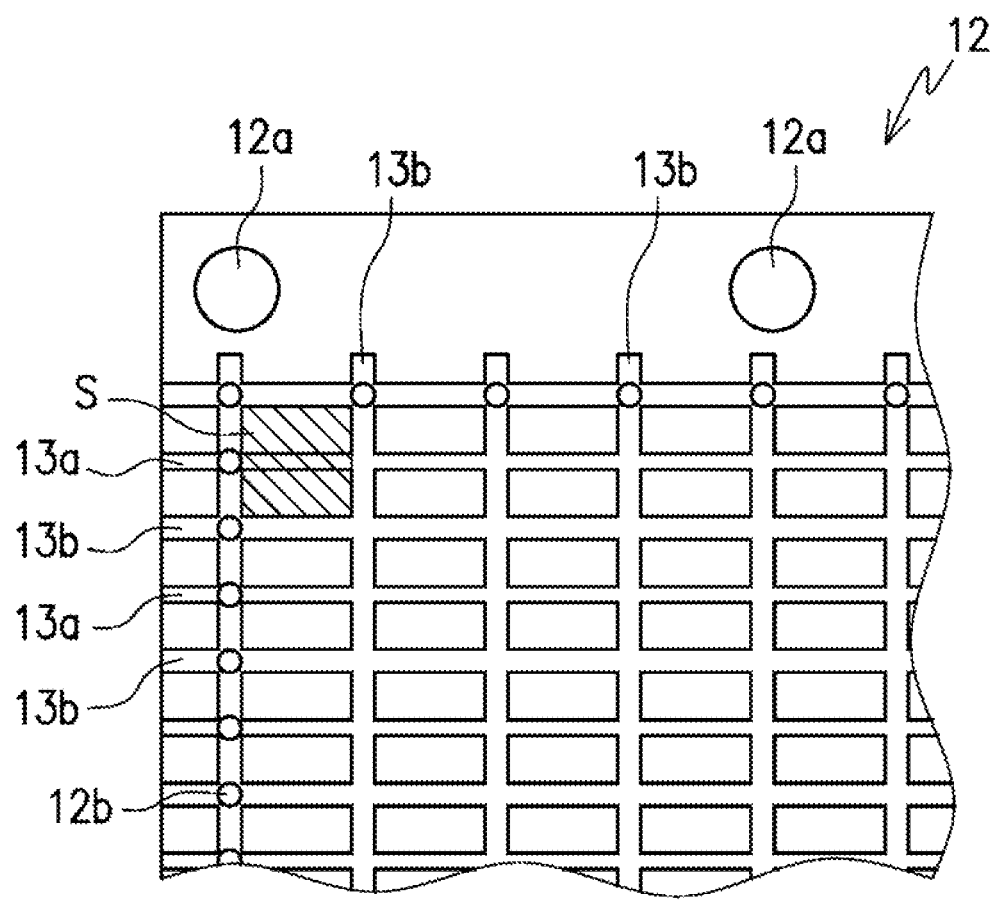

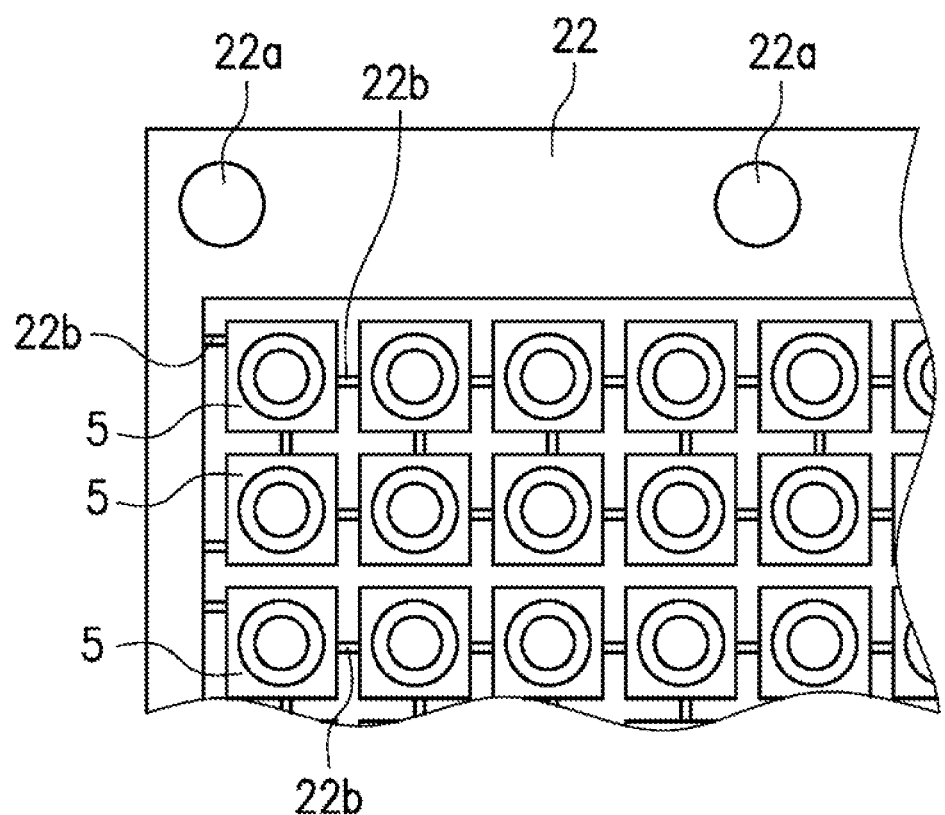
[Fig. 11]

[Fig. 12]
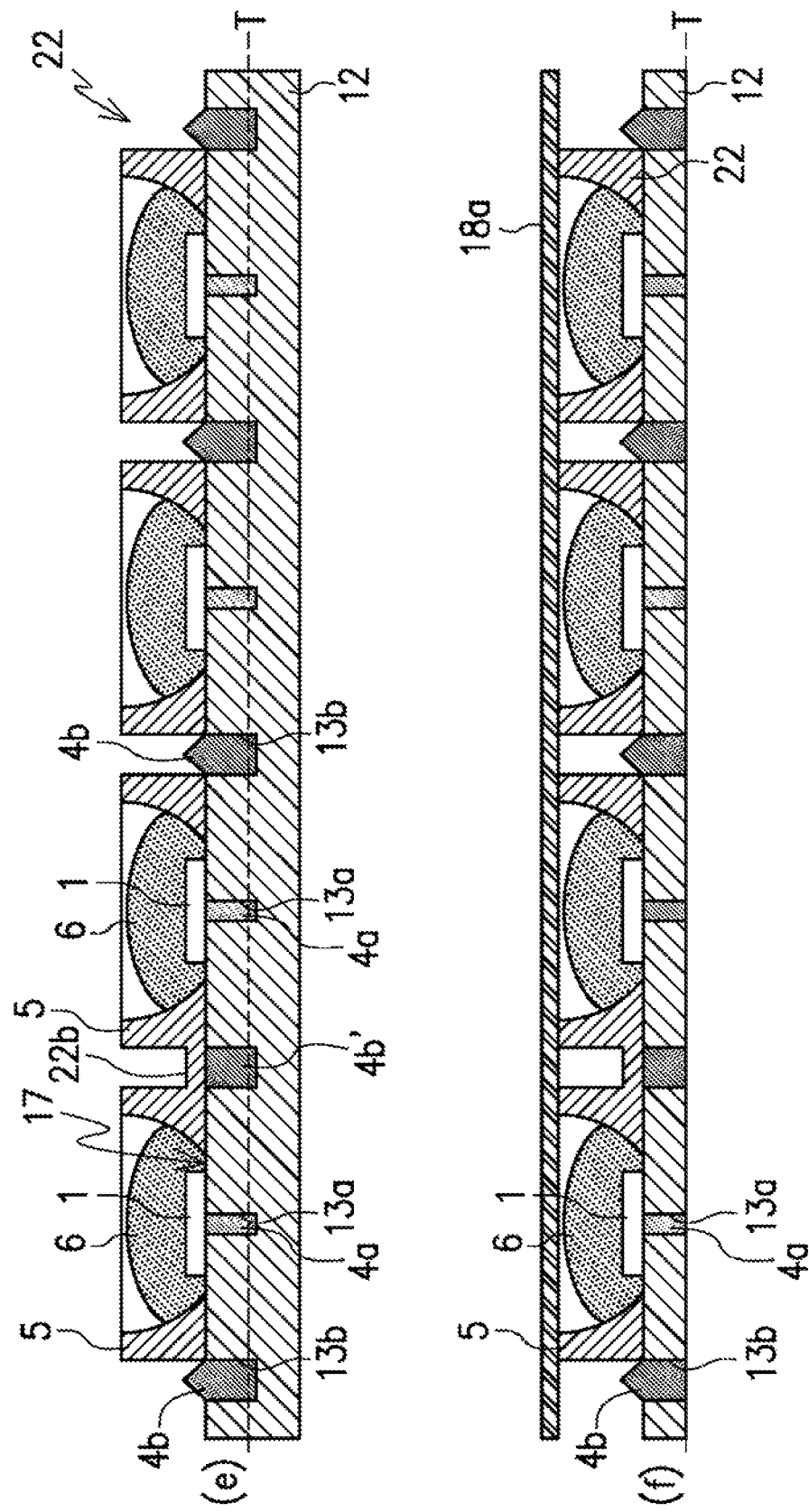

[Fig. 13]
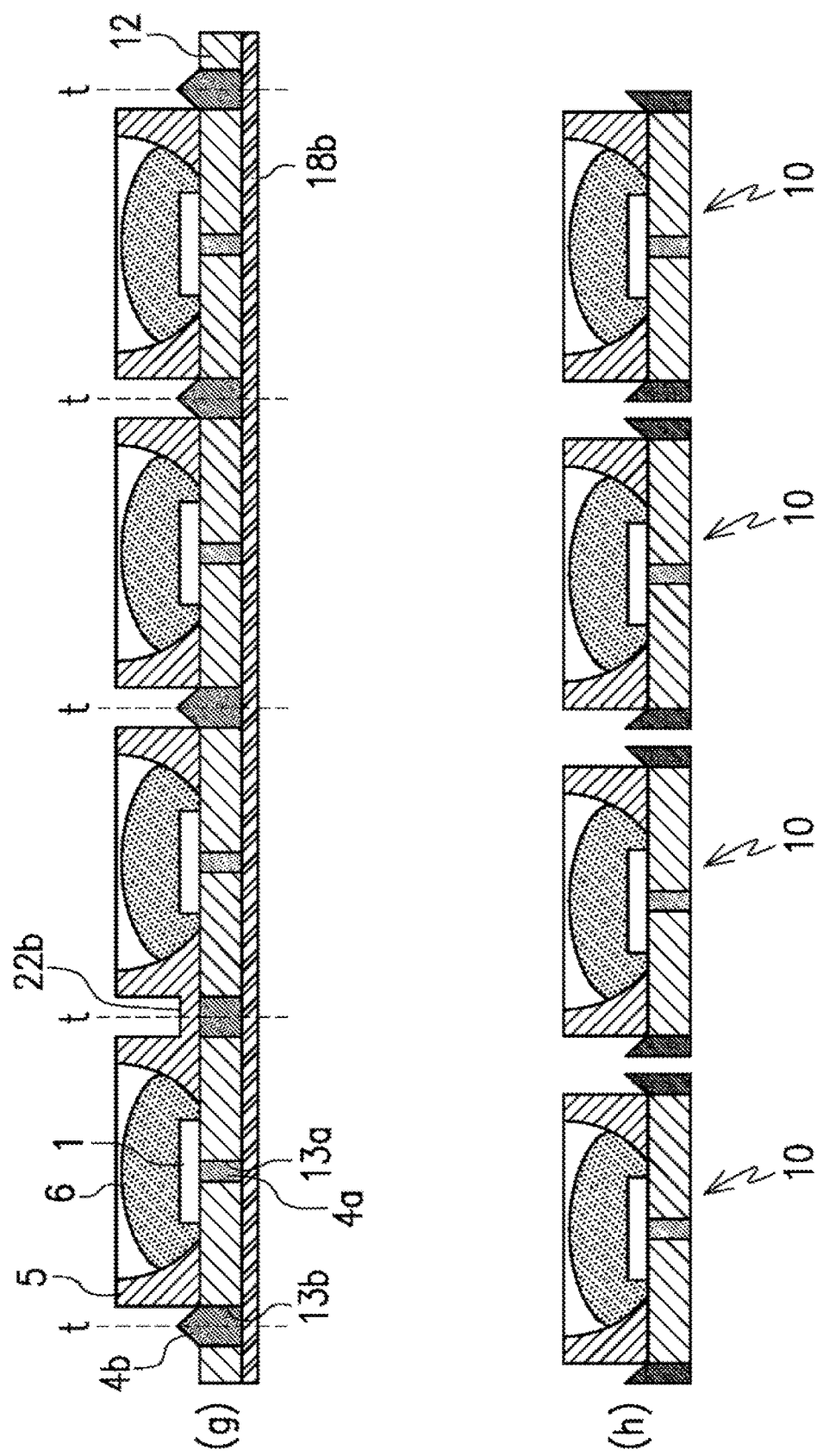

[Fig. 14]
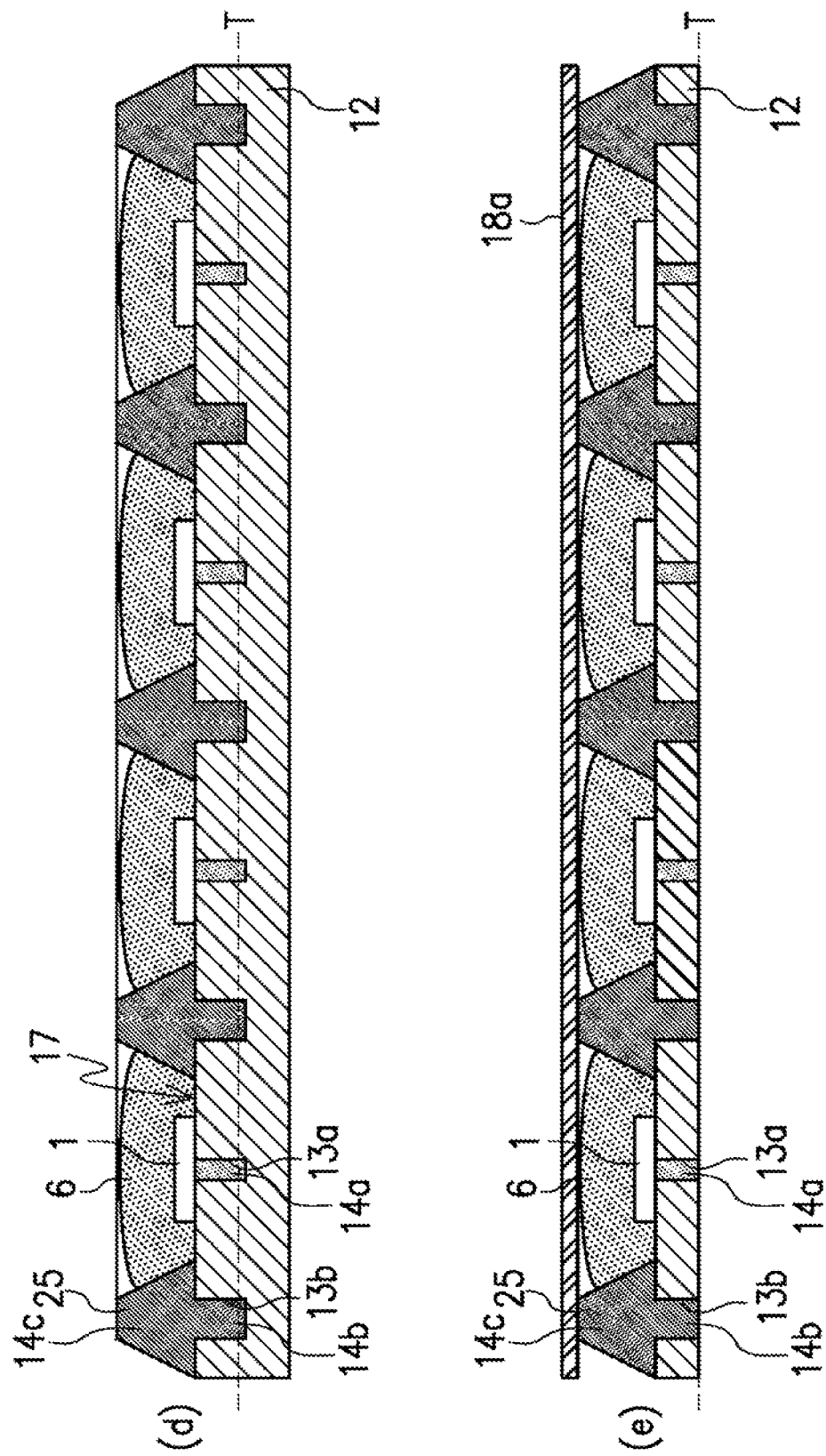

[Fig. 15]
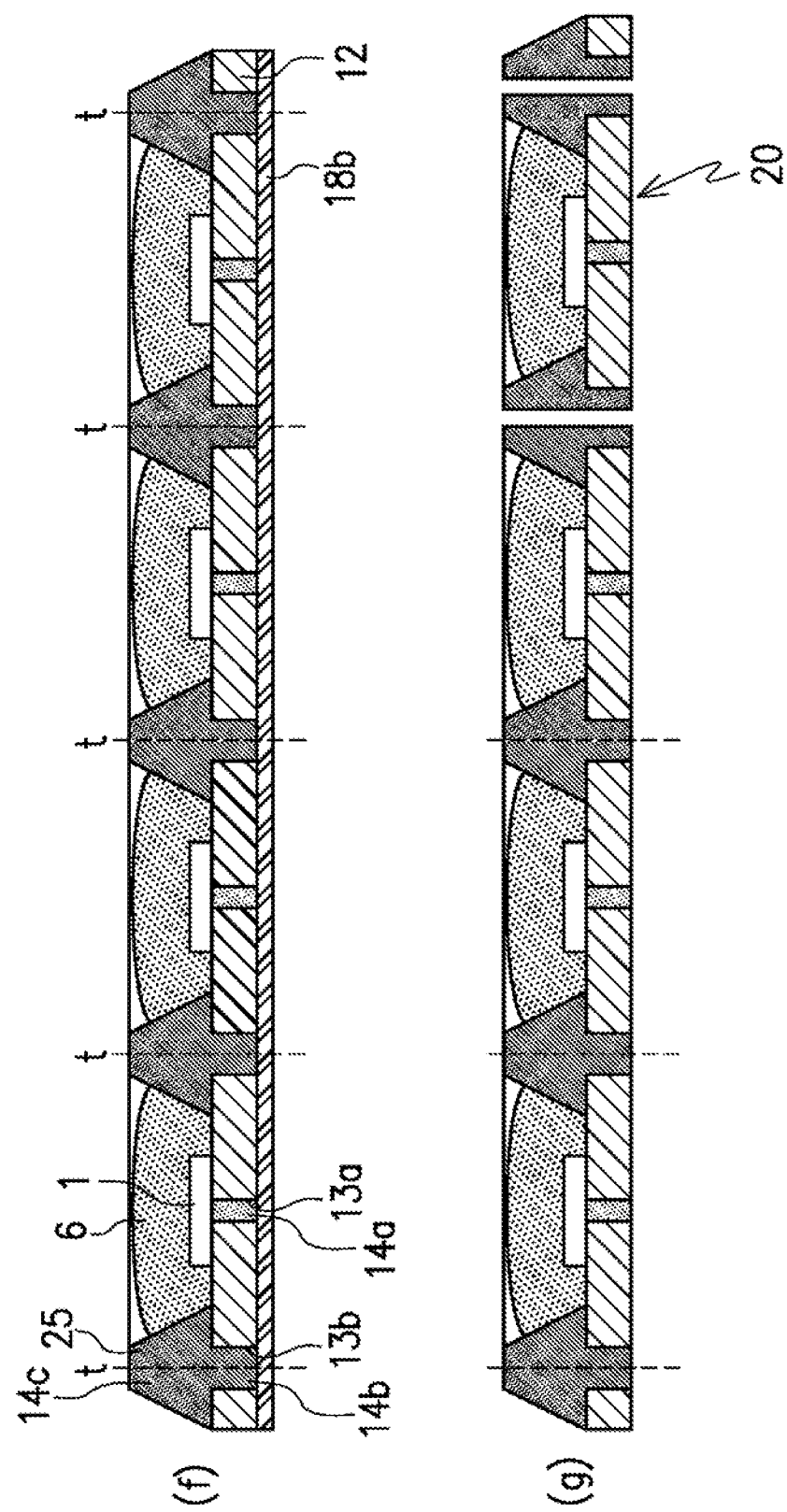

[Fig. 16]
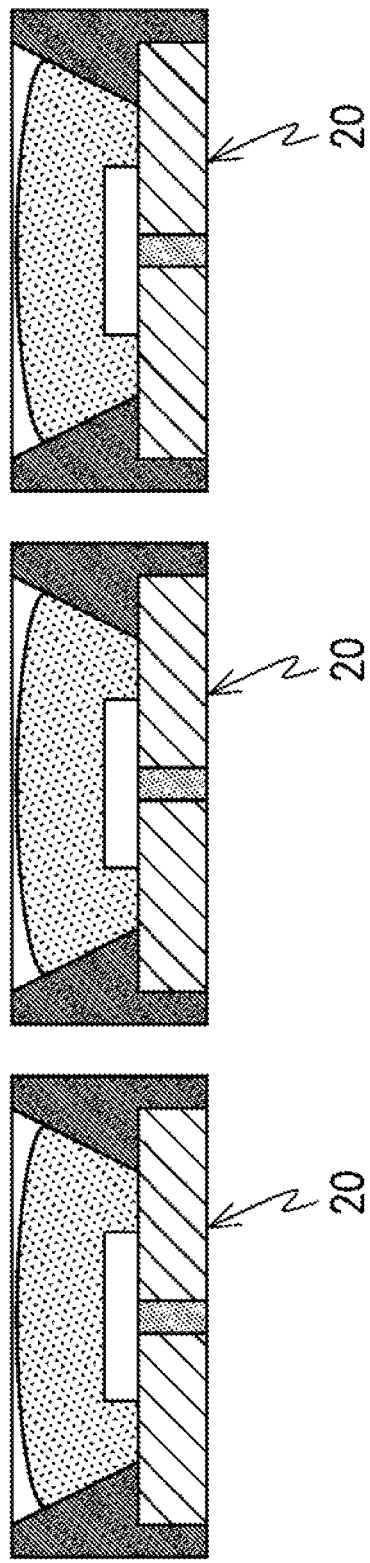

[Fig. 17]
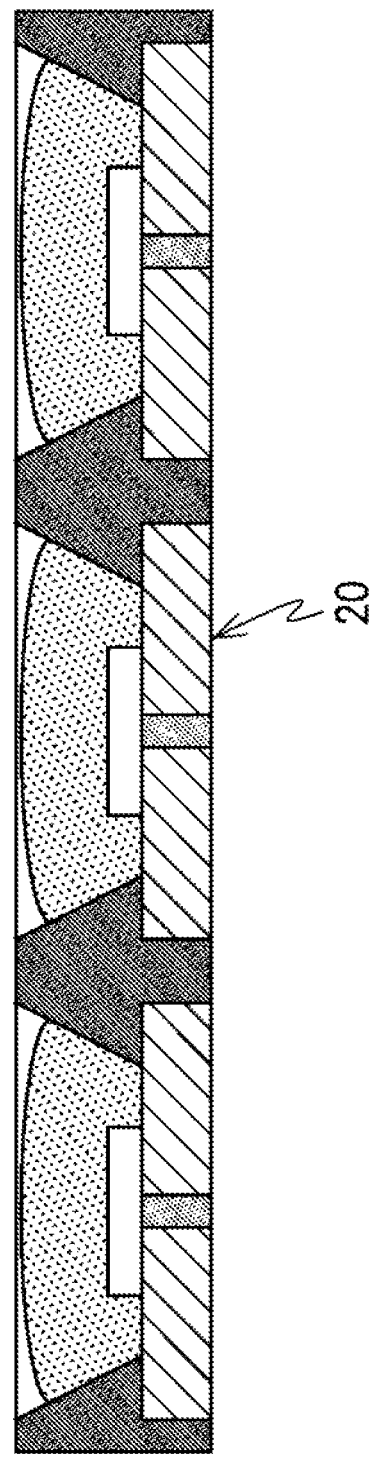

[Fig. 18]
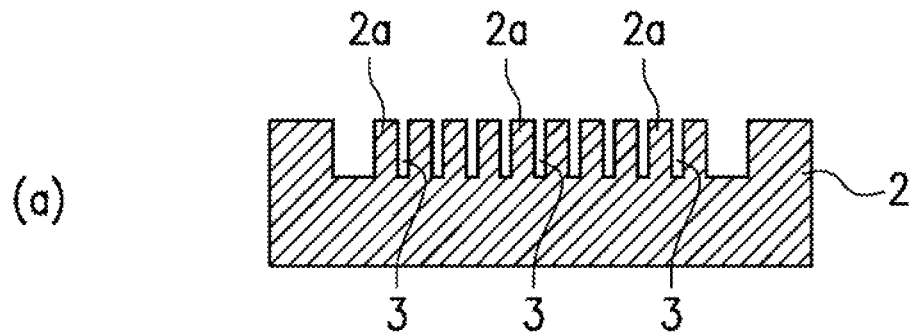
(a)
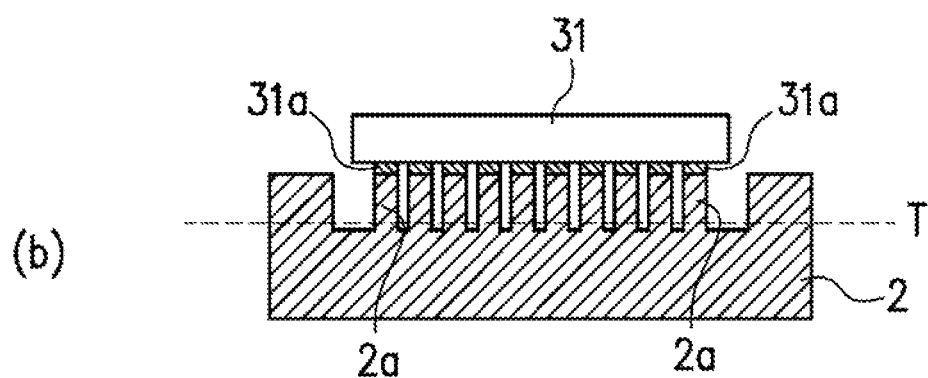
(b)
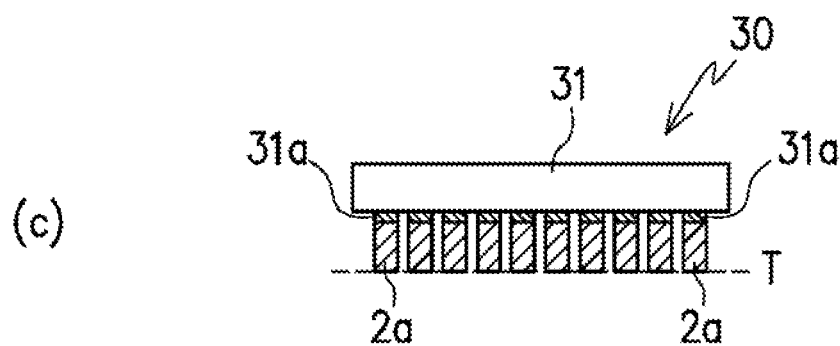
(c)

[Fig. 19]
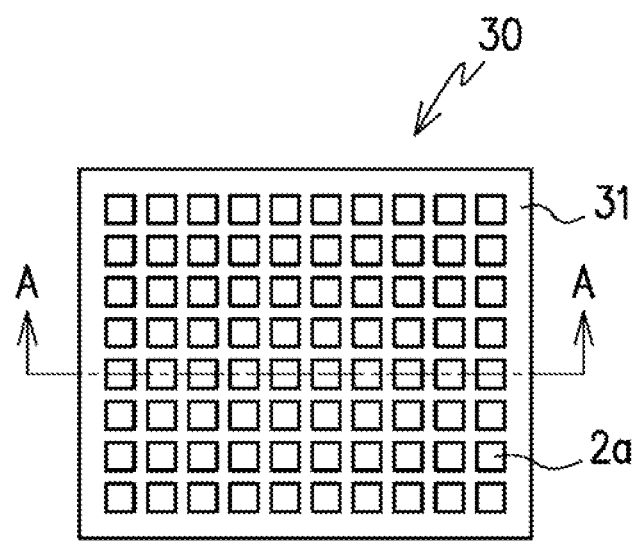
[Fig. 20]
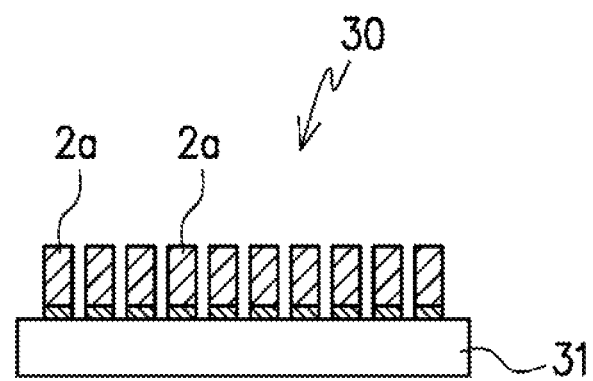

SEMICONDUCTOR DEVICE AND METHOD FOR PRODUCING THE SAME

TECHNICAL FIELD

The present invention relates to a semiconductor device that includes a semiconductor element mounted on a metal substrate and to a method for producing the semiconductor device. In particular, the present invention pertains to a semiconductor light-emitting device that includes a metal substrate on which a semiconductor light-emitting element and a reflector are mounted and to a method for producing the semiconductor light-emitting device.

BACKGROUND ART

Light-emitting diodes (LED) have become widely used in lighting devices in recent years. With the increasing use of the LED, demands for improved light-extraction efficiency, improved mass production efficiency, and cost reduction have increased in addition to reduction in the size and the thickness of the LED lighting devices. To reduce the size and the thickness of the devices and increase the light-extraction efficiency, semiconductor light-emitting devices that employ a flip-chip mounting have increased. In the flip-chip mounting, an LED element is directly bonded to a lead frame, which is a kind of metal substrates. Employment of the flip-chip mounting allows electrodes of the LED element to be located on the side facing the lead frame. This eliminates shields on the light radiation surface of the LED element and improves the light-extraction efficiency. Since connection leads of the LED element are formed to overlap the LED element, the size is reduced. Elimination of bonding wires further reduces the thickness.

The flip-chip mounting on the metal substrate has increased because the metal substrates are lower in cost compared with common resin substrates and because the metal substrates have superior heat dissipation. The semiconductor light-emitting device that employs the flip-chip mounting on the lead frame, however, has a plurality of connection leads arranged apart from each other in the lead frame to connect to the LED element. With this configuration, the difference in the heights between the connection leads, distortions, and warps are issues that need to be solved. The techniques for solving such issues include, as disclosed in patent document 1, a technique of inserting an electrically insulative reinforcing plate between the connection leads in the lead frame to correct warps.

For semiconductor wafers in other fields, a pre-dicing technique has been proposed to reduce the thickness (patent document 2). The pre-dicing technique includes, first, cutting grooves of a predetermined depth in a semiconductor wafer, backgrinding to allow the grooves to open on the backside, and cutting out semiconductor elements from the semiconductor wafer.

RELATED ART DOCUMENTS

Patent Documents

[Patent document 1] Japanese Unexamined Patent Publication No. 2013-157357 (See FIG. 2)

[Patent document 2] Japanese Unexamined Patent Publication No. 11-040520 (see FIG. 3)

DISCLOSURE OF THE INVENTION

Problems to be Solved by the Invention

As described above, to flip-chip mount the semiconductor element on the metal substrate, strains caused by the difference in the heights of the connection leads, distortions, and warps need to be reduced to increase the yield and the connection reliability. The techniques disclosed in the above-described patent documents 1 and 2 require the metal substrate to be punched by a press or partially dissolved by etching to separate the connection leads in order to electrically separate the connection leads in advance. The metal substrates are generally pressed taking into consideration of the mass productivity. Separating the connection leads, however, causes an internal strain that the metal substrate originally has and a stress strain generated by pressing to appear besides a strain caused by a thermal stress described in the above patent document 1. It is therefore difficult to correct those strains with only a reinforcing member like the reinforcing member disclosed in patent document 1, and the flatness of the connection leads of the metal substrate required in the flip-chip mounting has not been completely achieved.

Furthermore, as illustrated in FIG. 2 of patent document 1, if the flip-chip mounting is performed without providing conductive protrusions (bumps) on the electrodes of the semiconductor element or projections on the metal substrate, the difference between the heights of the connection leads, distortions, and warps are not absorbed by the height of the bumps, and demand for the flatness of the connection leads is further increased. When the reinforcing member is arranged on the backside of the lead frame, the electrodes of the semiconductor device cannot be arranged directly below the electrodes of the semiconductor element, which undesirably deteriorates heat dissipation. Use of the reinforcing member also increases the number of components and undesirably increases the costs and the number of processes. This results in the increase in the production period. Furthermore, the flow of resin in the following resin molding is hindered. This undesirably decreases the yield. In a case of separating the connection leads by etching also, the internal strain, the thermal stress, and the heat dissipation of the metal substrate are the same as those in the case of pressing. In addition, etching has low mass productivity and undesirably increases costs.

The problem of the strains in the metal substrate is caused by separating the connection leads of the metal substrate when flip-chip mounting the semiconductor element. The inventors considered applying the pre-dicing technique disclosed in patent document 2 to the metal substrate not for the purpose of preventing chipping of the semiconductor wafer during dicing, but for the purpose of reducing the strains in the connection leads caused by separating the connection leads. In this case, the metal substrate differs from the semiconductor wafer in that the material itself has workability in rolling. For this reason, when the metal substrate is ground and polished, metal burrs are generated in addition to the strains in the connection leads. As a result, the yield is undesirably reduced.

To solve the above-described problems, it is an object of the present invention to provide a method for producing a semiconductor device that improves yield and connection reliability, has good mass productivity, and in which a semiconductor element is flip-chip mounted on a metal substrate, which has excellent heat dissipation, and to provide the semiconductor device at low costs.

Means of Solving the Problems

To achieve the above object, in a semiconductor device including a metal substrate including a pair of electrodes and a semiconductor element configured to be mounted on the metal substrate and sealed with resin, a method for producing a semiconductor device according to one aspect of the present invention includes forming an electrode separating groove in an element mounting position on a main surface of the metal substrate at a predetermined depth. The semiconductor element is mounted to extend over the electrode separating groove. The metal substrate is ground from a surface reverse to the main surface of the metal substrate up to a position reaching the electrode separating groove.

With the above-described production method, since the semiconductor element is mounted on the metal substrate before cutting and separating connection leads formed of the metal substrate, mounting of the semiconductor element is completed before strains occur in processing of the metal substrate. That is, when the semiconductor element is mounted, the main surface of the metal substrate is kept flat, and the semiconductor element is allowed to be flip-chip mounted without forming bumps on the electrodes of the semiconductor element.

The first aspect of the present invention may further include injecting resin in the electrode separating groove.

In the first aspect of the present invention, the groove forming step may include forming a metal substrate holding groove around the element mounting position together with the electrode separating groove, and the resin injecting step may include injecting a metal substrate holding resin in the metal substrate holding groove.

Injecting the resin in the groove inhibits generation of grinding burrs in the following process for grinding and polishing the metal substrate to a predetermined depth from the surface reverse to the main surface of the metal substrate. The resin that fills the groove prevents the grinding burrs from entering the groove and causes the grinding burrs to be ground off. Thus, the metal burrs generated during grinding or polishing are reduced. Furthermore, since no strain is generated during metalworking, the main surface of the metal substrate is kept flat. This allows the electrodes to be directly adhered to each other without providing bumps on the semiconductor element or on the metal substrate.

The first aspect of the present invention may further include forming a reflector around the semiconductor element, which is mounted on the element mounting position on the main surface of the metal substrate.

In the first aspect of the present invention, the reflector forming step may include forming the reflector with the metal substrate holding resin, which is injected in the metal substrate holding groove.

The first aspect of the present invention may further include injecting a light-transmitting resin in the reflector to seal the semiconductor element.

According to another aspect of the present invention, in a semiconductor device including a metal substrate including a pair of electrodes and a semiconductor element configured to be mounted on the metal substrate and sealed with resin, a method for producing semiconductor devices includes the following four steps: (1) forming electrode separating grooves in a plurality of element mounting positions on a main surface of a large metal substrate at a predetermined depth, (2) mounting semiconductor elements each extending over the associated electrode separating groove, (3) grinding the metal substrate from a surface reverse to the main surface of the metal substrate up to a position reaching the electrode separating grooves, and (4) cutting the large metal substrate in areas each including the semiconductor element mounted on the associated element mounting position to separate into semiconductor devices.

Another aspect of the present invention may further include injecting resin in the electrode separating grooves.

In another aspect of the present invention, the groove forming step may include forming metal substrate holding grooves around the element mounting positions together with the electrode separating grooves, and the resin injecting step may include injecting a metal substrate holding resin in the metal substrate holding grooves.

With the above-described production method, the semiconductor devices having desired properties are easily mass produced using the large metal substrate. That is, the semiconductor devices are mass produced very efficiently by simultaneously forming the electrode separating grooves and the metal substrate holding grooves in the large metal substrate, simultaneously injecting the resin in the grooves, and simultaneously grinding the rear surface of the large metal substrate.

Another aspect of the present invention may further include forming reflectors around the semiconductor elements, which are mounted on the element mounting positions on the main surface of the large metal substrate.

In another aspect of the present invention, the reflector forming step may include stacking a reflector large substrate comprising a plurality of reflectors corresponding to the element mounting positions on the main surface of the large metal substrate.

In another aspect of the present invention, the reflector forming step may include forming the reflectors with the metal substrate holding resin, which is injected in the metal substrate holding grooves.

Another aspect of the present invention may include adhering a grinding protective sheet to the surface of the elements on the main surface of the large metal substrate prior to the grinding step.

Damages on the semiconductor elements or components are reduced during grinding of the rear surface of the large metal substrate by adhering the protective sheet for grinding or polishing on the side of the large metal substrate on which the semiconductor elements are mounted as described above.

In another aspect of the present invention, the cutting and separating step may include cutting the large metal substrate at a predetermined position of the metal substrate holding resin.

Another aspect of the present invention may include adhering a cutting protective sheet on the rear surface of the large metal substrate prior to the cutting and separating step.

Damages on the semiconductor elements or components are reduced during an element separating process by adhering the cutting protective sheet on the rear surface of the large metal substrate as described above.

The semiconductor device produced by the above production method may be a single-element semiconductor device in which elements are cut and separated one each, or a multi-element semiconductor device in which multiple elements are cut and separated as one unit.

Effects of the Invention

According to the present invention, since the semiconductor element is mounted on the metal substrate before cutting and separating the connection leads formed of the metal substrate, mounting of the semiconductor element is completed before strains occur in processing of the metal substrate. That is, when the semiconductor element is mounted, the main surface of the metal substrate is kept flat, and the semiconductor element is allowed to be flip-chip mounted without forming bumps on the electrodes of the semiconductor element.

BRIEF DESCRIPTION OF THE DRAWINGS

FIG. 1 is a cross-sectional view of a semiconductor light-emitting device according to a first embodiment of the present invention;

FIG. 2 is a plan view of the semiconductor light-emitting device illustrated in FIG. 1;

FIG. 3 is a flowchart illustrating the first half of a method for producing the semiconductor light-emitting device illustrated in FIG. 1;

FIG. 4 is a flowchart illustrating the last half of the method for producing the semiconductor light-emitting device illustrated in FIG. 1;

FIG. 5 is a cross-sectional view of a semiconductor light-emitting device according to a second embodiment of the present invention;

FIG. 6 is a plan view of the semiconductor light-emitting device illustrated in FIG. 5;

FIG. 7 is a flowchart illustrating the first half of a method for producing the semiconductor light-emitting device illustrated in FIG. 5;

FIG. 8 is a flowchart illustrating the last half of the method for producing the semiconductor light-emitting device illustrated in FIG. 5;

FIG. 9 is a partial plan view of a large metal substrate used for semiconductor light-emitting devices according to a third embodiment of the present invention;

FIG. 10 is a partial plan view of the large metal substrate showing a state in which electrode separating grooves and metal substrate holding grooves are formed in the large metal substrate illustrated in FIG. 9;

FIG. 11 is a partial plan view of a large reflector substrate used in the semiconductor light-emitting devices according to the third embodiment of the present invention;

FIG. 12 is a flowchart illustrating the first half of a method for producing the semiconductor light-emitting devices according to the third embodiment of the present invention;

FIG. 13 is a flowchart illustrating the last half of the process for producing the semiconductor light-emitting devices according to the third embodiment of the present invention;

FIG. 14 is a flowchart illustrating the first half of a method for producing semiconductor light-emitting devices according to a fourth embodiment of the present invention;

FIG. 15 is a flowchart illustrating the last half of the method for producing the semiconductor light-emitting devices according to the fourth embodiment of the present invention;

FIG. 16 is a cross-sectional view of semiconductor light-emitting devices cut and separated one each;

FIG. 17 is a cross-sectional view of a semiconductor light-emitting device cut and separated as one semiconductor light-emitting device including three semiconductor light-emitting elements;

FIG. 18 is a flowchart illustrating a method for producing a power control semiconductor device according to a fifth embodiment of the present invention;

FIG. 19 is a plan view of the power control semiconductor device produced by the method of FIG. 18 as viewed from the side on which the electrodes are provided; and FIG. 20 is a cross-sectional view of the power control semiconductor device taken along the line A-A of FIG. 19.

MODE FOR CARRYING OUT THE INVENTION

A semiconductor light-emitting device according to an embodiment of the present invention and a method for producing the semiconductor light-emitting device will hereafter be described with reference to the drawings. Semiconductor light-emitting devices are widely used among semiconductor devices. A semiconductor light-emitting element is therefore described as an example of a semiconductor element mounted on a semiconductor light-emitting device. In each of embodiments, like or the same reference numerals are given to those components that are like or the same as the corresponding components and redundant explanations are omitted.

(First Embodiment)

FIGS. 1 to 4 illustrate a semiconductor light-emitting device 10 according to a first embodiment of the present invention. FIG. 1 is a cross-sectional view of a semiconductor light-emitting device 10. FIG. 2 is a plan view of the semiconductor light-emitting device 10 illustrated in FIG. 1. FIG. 3 is a flowchart illustrating the first half of a method for producing the semiconductor light-emitting device 10. FIG. 4 is a flowchart illustrating the last half of the method for producing the semiconductor light-emitting device 10.

As illustrated in FIGS. 1 and 2, the semiconductor light-emitting device 10 includes a metal substrate 2. The metal substrate 2 forms a printed circuit board. The metal substrate 2 includes an electrode separating groove 3a at the center, and the electrode separating groove 3a receives an electrode separating resin 4a. The metal substrate 2 includes a pair of electrodes 2a, 2b each located on different side of the electrode separating groove 3a. The pair of electrodes 2a, 2b form an element mounting position 7. A semiconductor light-emitting element 1 is flip-chip mounted on the pair of electrodes 2a, 2b. A reflector 5 is formed on a main surface of the metal substrate 2, that is, around the element mounting position 7, on which the semiconductor light-emitting element 1 is mounted. The reflector 5 receives a light-transmitting resin 6. The light-transmitting resin 6 is injected in an internal portion surrounded by the reflector 5 to seal the semiconductor light-emitting element 1.

The electrode separating resin 4a, which has been injected in the electrode separating groove 3a, and a metal substrate holding resin 4b integrate the metal substrate 2 and keep the strength. The metal substrate holding resin 4b is injected in a metal substrate holding groove, which will be discussed below. The light-transmitting resin 6, which has been injected inside the reflector 5, is a transparent resin or a fluorescent resin. As an example, a semiconductor light-emitting device that emits white light is formed using a blue LED and a YAG phosphor. The blue LED serves as the semiconductor light-emitting element 1. The YAG phosphor is used in the fluorescent resin.

Next, a method for producing the above-described semiconductor light-emitting device 10 will be described with reference to FIGS. 3 and 4. FIG. 3 illustrates production processes (a) to (d). The production processes (a) to (d) are the first half of the processes for producing the semiconductor light-emitting device 10. FIG. 4 illustrates production processes (e) to (h). The production processes (e) to (h) are the last half of the processes for producing the semiconductor light-emitting device 10. The production process (a) in FIG. 3 is a groove forming process, and the electrode separating groove 3a and a metal substrate holding groove 3b are formed at a predetermined depth. The electrode separating groove 3a is formed at the center portion on the surface of the metal substrate 2. The metal substrate holding groove 3b is formed around the element mounting position 7. The production process (b) is a resin injecting process. The electrode separating resin 4a is injected in the electrode separating groove 3a, and the metal substrate holding resin 4b is injected in the metal substrate holding groove 3b.

The metal substrate 2 is preferably a copper plate or a copper alloy plate having a thickness of 0.2 mm to 1.0 mm to keep the strength of the substrate although the above-described grooves are formed. This embodiment uses a copper plate having a thickness of 0.3 mm. The electrode separating resin 4a and the metal substrate holding resin 4b injected in the grooves are preferably, for example, epoxies, silicone resins, and a liquid crystal polymer.

The production process (c) is an element mounting process. The semiconductor light-emitting element 1 is flip-chip mounted on the electrodes 2a, 2b on the surface of the metal substrate 2, which is separated by the electrode separating groove 3a. The surface of the metal substrate 2 is kept flat even after the groove forming process and the resin injecting process. This allows the semiconductor light-emitting element 1 to be flip-chip mounted directly on the surface of the metal substrate 2, which includes the electrodes 2a, 2b, without forming bumps on the electrodes of the semiconductor light-emitting element 1 or forming protruding electrodes on the electrodes 2a, 2b of the metal substrate 2. As a matter of course, forming protruding electrodes on the electrodes of the semiconductor light-emitting element 1 or on the electrodes 2, 2b of the metal substrate 2 further improves mounting property. Depending on the structure of the semiconductor light-emitting element, wire bonding can also be performed.

The production process (d) is a reflector forming process. The reflector 5 is formed around the semiconductor light-emitting element 1, which is mounted on the element mounting position 7 on the main surface of the metal substrate 2. In this embodiment, the reflector 5 is made of metal and has a superior reflection property. The reflector 5 is bonded to the main surface of the metal substrate 2 with an insulative adhesive.

The production process (e) in FIG. 4 is a sealing resin injecting process, and the light-transmitting resin 6 such as a transparent resin or a fluorescent resin is injected in the interior of the reflector 5. The light-transmitting resin 6 seals the semiconductor light-emitting element 1 and functions to convert the wavelength of light emitted from the semiconductor light-emitting element 1.

The production process (f) is a grinding process. The rear surface of the metal substrate 2 is ground to a position of cutting line T shown by a broken line in FIGS. 4(e) and 4(f) so that the electrode separating resin 4a, which has been injected in the electrode separating groove 3a, is exposed to separate the pair of electrodes 2a, 2b. In the grinding process, a grinding protective sheet 8a is desirably adhered to the upper surface of the reflector 5, and the metal substrate 2 is desirably mounted on a grinding machine together with the grinding protective sheet 8a. This prevents the semiconductor light-emitting element 1, the reflector 5, and the light-transmitting resin 6, which are mounted on the surface of the metal substrate 2, from being damaged by grinding and polishing the rear surface of the metal substrate 2.

Injecting the electrode separating resin 4a in the electrode separating groove 3a of the metal substrate 2 and the metal substrate holding resin 4b in the metal substrate holding groove 3b inhibits generation of grinding burrs in the grinding process. That is, since the resins 4a, 4b injected in the grooves 3a, 3b prevent the grinding burrs from entering the grooves 3a, 3b and cause the burrs to be ground off, the burrs generated in the grinding process are reduced.

The production process (g) is a cutting and separating process. The metal substrate 2 is cut in an area including the semiconductor light-emitting element 1. In this embodiment, cutting the metal substrate 2 at the position of cutting lines t shown by broken lines, that is, at the center of the metal substrate holding resin 4b completes the semiconductor light-emitting device 10 illustrated in the production process (h). In the semiconductor light-emitting device 10, the semiconductor light-emitting element 1 is flip-chip mounted on the flat surface of the metal substrate 2 before the rear surface of the metal substrate 2 is ground as described above. The grinding process separates the metal substrate 2 at the pair of electrodes 2a, 2b. However, the electrode separating resin 4a, which is applied to the center of the metal substrate 2, the metal substrate holding resin 4b, which is applied to surround the circumference of the metal substrate 2, and the reflector 5, which is secured to the surface of the metal substrate 2, integrate the metal substrate 2 and keep the strength of the metal substrate 2. Before the cutting and separating process, a cutting protective sheet 8b is bonded to the rear surface of the metal substrate 2, and the metal substrate 2 is cut together with the cutting protective sheet 8b.

(Second Embodiment)

FIGS. 5 to 8 illustrate a semiconductor light-emitting device 20 according to a second embodiment of the present invention and a method for producing the semiconductor light-emitting device. FIG. 5 is a cross-sectional view of a semiconductor light-emitting device 20, and FIG. 6 is a plan view of the semiconductor light-emitting device 20 illustrated in FIG. 5. FIG. 7 is a flowchart illustrating the first half of the method for producing the semiconductor light-emitting device 20. FIG. 8 is a flowchart illustrating the last half of the method for producing the semiconductor light-emitting device 20.

The semiconductor light-emitting device 20 of this embodiment is approximately the same as the semiconductor light-emitting device 10 described above in the basic configuration except that a reflector forming resin 4c is formed integrally with the metal substrate holding resin 4b, which is provided around the metal substrate 2. The reflector forming resin 4c forms the reflector 25. Like or the same reference numerals are given to those components that are like or the same as the corresponding components and detailed explanations are omitted.

A method for producing the above-described semiconductor light-emitting device 20 will now be described with reference to FIGS. 7 and 8. FIG. 7 illustrates production processes (a) to (d). The production processes (a) to (d) are the first half of the processes for producing the semiconductor light-emitting device 20. FIG. 8 illustrates production processes (e) to (g). The production processes (e) to (g) are the last half of the processes for producing the semiconductor light-emitting device 20. The production process (a) in FIG. 7 is a groove forming process and is the same as the production process (a) in FIG. 3 according to the first embodiment. In the groove forming process, the electrode separating groove 3a and the metal substrate holding groove 3b are formed at a predetermined depth. The electrode separating groove 3a is formed at the center portion on the surface of the metal substrate 2. The metal substrate holding groove 3b is formed around the element mounting position 7. The production process (b) is a resin injecting process.

The electrode separating resin 4a is injected in the electrode separating groove 3a, and the metal substrate holding resin 4b is injected in the metal substrate holding groove 3b. The metal substrate holding resin 4b is formed integrally with the reflector forming resin 4c. The reflector forming resin 4c projects from the surface of the metal substrate 2.

The reflector forming resin 4c has an approximately trapezoidal cross-section having a lower base that is wider than the groove width of the metal substrate holding groove 3b. The reflector forming resin 4c has approximately the same height as the reflector 5 of the semiconductor light-emitting device 10 according to the first embodiment and forms the reflector 25.

The production process (c) is an element mounting process and corresponds to the production process (c) in FIG. 3 according to the first embodiment. That is, the semiconductor light-emitting element 1 is flip-chip mounted on the electrodes 2a, 2b on the surface of the metal substrate 2, which is separated by the electrode separating groove 3a.

The production process (d) is a sealing resin injecting process and corresponds to the production process (e) in FIG. 4 according to the first embodiment. That is, the semiconductor light-emitting element 1 is sealed by injecting the light-transmitting resin 6 such as a transparent resin or a fluorescent resin inside the reflector 25. Cutting line T shown by a broken line indicates the depth by which the rear surface of the metal substrate 2 is ground in the following grinding process.

The production process (e) in FIG. 8 is a grinding process and corresponds to the production process (f) in FIG. 4 according to the first embodiment. As described above, the rear surface of the metal substrate 2 is ground to the position of cutting line T shown by a broken line to expose the electrode separating resin 4a, which has been injected in the electrode separating groove 3a. In the grinding process, the grinding protective sheet 8a is bonded to the upper surface of the reflector forming resin 4c like the first embodiment.

The production process (f) is a cutting and separating process and corresponds to the production process (g) in FIG. 4 according to the first embodiment. The metal substrate 2 is cut in an area including the semiconductor light-emitting element 1. In this embodiment, cutting the metal substrate 2 at the position of cutting lines t shown by broken lines, that is, at the center of the reflector forming resin 4c and the metal substrate holding resin 4b completes the semiconductor light-emitting device 20 illustrated in the production process (g). The reflector forming resin 4c that has been cut forms the reflector 25, which surrounds the element mounting position 7. Like the first embodiment, a process for adhering the cutting protective sheet 8b on the rear surface of the metal substrate 2 is provided before the cutting and separating process.

The semiconductor light-emitting device 20 according to this embodiment differs from the semiconductor light-emitting device 10 of the first embodiment in that the reflector 25 is formed simultaneously with the metal substrate holding resin 4b, and the reflector 5 that comes in a separate member is unnecessary. That is, since the reflector 25 is formed integrally with the metal substrate holding resin 4b at the same time, the separate reflector 5 is unnecessary. This also reduces the size. Simultaneously injecting the metal substrate holding resin 4b and the reflector forming resin 4c in the metal substrate holding groove 3b reduces the number of processes and thus reduces the production period and the production costs. The resin used in this process is commonly used for the reflector. For this reason, resin including a white resin in which a reflection material such as titanium oxide has been mixed is desirable. In this embodiment, a silicone resin that includes titanium oxide is used to perform injection molding.

(Third Embodiment)

FIGS. 9 to 12 illustrate semiconductor light-emitting devices according to a third embodiment of the present invention. This embodiment employs a collective substrate method that uses a large metal substrate 12 to mass produce the semiconductor light-emitting device 10 of the first embodiment.

FIG. 9 is a partial plan view of the large metal substrate 12. Since the substrate strength needs to be maintained although the grooves are formed in the substrate, the large metal substrate 12 is preferably a copper plate or a copper alloy plate having a thickness of 0.2 mm to 1.0 mm. In this embodiment, a copper plate having a length of 78 mm×62 mm and a thickness of 0.3 mm is used. Multiple reference holes 12a are formed along one side of the copper plate, and alignment holes 12b are formed in the peripheral portion of the copper plate to serve as a position reference in forming the grooves. Since the reference holes 12a and the alignment holes 12b are formed with the same mold during processing of the large metal substrate 12, the position accuracy is high.

FIG. 10 is a partial plan view of the large metal substrate 12 illustrating a state in which electrode separating grooves 13a and metal substrate holding grooves 13b are formed in the large metal substrate 12. Since the electrode separating grooves 13a and the metal substrate holding grooves 13b are diced with reference to the reference holes 12a, the electrode separating grooves 13a and the metal substrate holding grooves 13b are accurately formed at a predetermined depth. Specifically, the metal substrate holding grooves 13b are formed in the large metal substrate 12 in a checkered pattern. A square area that is defined by the metal substrate holding grooves 13b with the electrode separating groove 13a located at the center corresponds to a configuration area S for forming the individual semiconductor light-emitting device.

As described above, in this embodiment, the electrode separating grooves 13a and the metal substrate holding grooves 13b are formed in the large metal substrate 12 at positions specified by the alignment holes 12b in the dicing process. More specifically, a dicing tape is adhered to a surface reverse to the dicing surface of the large metal substrate 12. The large metal substrate 12 is placed in a dicing device together with the dicing tape, and the grooves are formed by dicing. In this case, when the grooves are formed by dicing, metal burrs (dicing burrs) are formed. The dicing burrs that are formed on the upper surface of the large metal substrate 12 particularly raises issues. However, the dicing burrs are removed after dicing by polishing the upper surface of the large metal substrate 12.

After the dicing burrs are removed, the dicing tape is peeled off to make the large metal substrate 12 in which the electrode separating grooves 13a and the metal substrate holding grooves 13b are formed. In this embodiment, the metal substrate holding grooves 13b having a groove width of 0.3 mm and a groove depth of 0.15 mm and the electrode separating grooves 13a having a groove width and a groove depth of 0.15 mm are formed. The positions of the grooves are determined by the position of electrodes that need to be electrically separated on the semiconductor light-emitting element, the distance between the electrodes, and the size of the semiconductor light-emitting device, which is a base unit, and the grooves are arranged on the large metal substrate 12 in a checkered pattern. In this embodiment, the case in which the grooves are formed by dicing is described.

However, the grooves can certainly be made by other machining methods such as pressing. The metal substrate holding grooves 13b, which are formed in the large metal substrate 12, function as separating grooves for separating multiple semiconductor light-emitting devices and separate the multiple semiconductor light-emitting devices formed on the large metal substrate 12.

FIG. 11 is a partial plan view of a large reflector substrate 22. The large reflector substrate 22 includes multiple reflectors. The large reflector substrate 22 includes reference holes 22a, multiple reflectors 5, and connecting portions 22b. The connecting portions 22b connect adjacent reflectors 5 with each other. The size and the position of the reflectors 5 correspond to configuration areas S of the semiconductor light-emitting devices, which are formed on the large metal substrate 12. Since the reflectors 5 form reflection surfaces, the large reflector substrate 22 is preferably a metal plate having a thickness of 0.2 to 3 mm or a substrate having an optical reflection layer formed on the surface of the substrate. In this embodiment, an aluminum plate having a length of 78 mm×62 mm and a thickness of 0.3 mm is used.

A mass production process for the semiconductor light-emitting device 10 using the large metal substrate 12 and the large reflector substrate 22 will now be described with reference to FIGS. 12 and 13. Processes of the production method using the large metal substrate 12 are basically the same as the production processes (a) to (h) for the semiconductor light-emitting device 10 illustrated in FIGS. 3 and 4. Description for the production processes (a) to (d) illustrated in FIG. 3 are therefore omitted, and only the production processes (e) to (h) illustrated in FIG. 4 will be described.

The production process (e) in FIG. 12 is a sealing resin injecting process. Since FIG. 12 illustrates the groove forming process to the sealing resin injecting process, those processes will be briefly described. First, the electrode separating grooves 13a and the metal substrate holding grooves 13b are formed in the large metal substrate 12 illustrated in FIG. 10. The electrode separating resin 4a is injected in the electrode separating grooves 13a, and the metal substrate holding resin 4b is injected in the metal substrate holding grooves 13b. Subsequently, the semiconductor light-emitting elements 1 are flip-chip mounted on element mounting positions 17. The element mounting positions 17 correspond to the electrode separating grooves 13a of the large metal substrate 12.

Next, the large reflector substrate 22 illustrated in FIG. 11 is stacked on the large metal substrate 12. Stacking of the large reflector substrate 22 on the large metal substrate 12 is performed by aligning the reference holes 12a, 22a, which are formed in the large metal substrate 12 and the large reflector substrate 22. The metal substrate holding resin 4b projects from the surface of the large metal substrate 12. The reflectors 5 of the large reflector substrate 22 are aligned with the element mounting positions 17 on the large metal substrate 12 when the metal substrate holding resin 4b enters gaps between the reflectors 5 of the large reflector substrate 22. Thus, the reflectors 5 are accurately positioned with respect to the element mounting positions 17. Part of the metal substrate holding resin 4b on the large metal substrate 12 that corresponds to the connecting portions 22b, which connect the reflectors 5 of the large reflector substrate 22, in other words, a metal substrate holding resin 4b'does not project from the surface of the large metal substrate 12. This configuration allows the large reflector substrate 22 to be stacked on the large metal substrate 12. Subsequently, the light-transmitting resin 6 is injected inside the reflectors 5, which are formed on the large metal substrate 12, to seal the semiconductor light-emitting elements 1. This completes the sealing resin injecting process of the production process (e).

The electrode separating resin 4a and the metal substrate holding resin 4b can be applied by, for example, transferring, injecting, and dropping. The resin to be applied includes various kinds of resins such as epoxies, silicone resins, and a liquid crystal polymer. In this embodiment, the silicone resin is applied by injection.

The stacking of the large reflector substrate 22 on the large metal substrate 12 will now be described in detail. The above-described large metal substrate 12 and the large reflector substrate 22 are stacked by being adhered to each other. The material of the reflectors 5 formed on the large reflector substrate 22 may be a metal material such as aluminum and silver, glass, an optical material, or a composite material of these materials. If the reflectors 5 are made of a conductive material, the adhesive needs to keep electrical insulation between the reflectors 5 and the large metal substrate 12. Resins such as an epoxy resin, an acrylic resin, and a silicone resin may be used. Those resins have a heat resistance that withstands temperatures greater than or equal to a reflow temperature when the semiconductor light-emitting elements 1 are mounted and a high thixotropy to prevent resin bleed (overflow of resin during adhesion). Furthermore, considering the fact that the semiconductor light-emitting elements 1 are mounted on the large metal substrate 12, a stamping method is suitable as a method for applying the adhesive. The adhesive may also be applied by dispensing or in a tape form. In this embodiment, an epoxy adhesive having a high viscosity is applied by stamping.

To stack the large reflector substrate 22 on the large metal substrate 12, first, the reference holes 12a of the large metal substrate 12 are inserted to positioning pins to secure the large metal substrate 12. Subsequently, an epoxy adhesive layer having a predetermined thickness is formed on a joint surface of the large reflector substrate 22, on which the reflectors 5 are formed, by squeezing. The large reflector substrate 22 is then overlaid on the large metal substrate 12. At this time, the large reflector substrate 22 is adhered to the large metal substrate 12 while the reference holes 22a of the large reflector substrate 22 are inserted to the positioning pins. Even if there is a displacement in the position accuracy of the reflectors 5 formed on the large reflector substrate 22, the position is corrected by the metal substrate holding resin 4b, which projects from the large metal substrate 12. Thus, the final position accuracy is improved. Subsequently, the adhesive is cured by a heating process so that the reflectors 5 are secured to the large metal substrate 12. As a result, light emitted from the side surfaces of each semiconductor light-emitting element 1 is reflected upward by the associated reflector 5. This configuration improves the light-extraction efficiency.

The production process (f) is a grinding process. The rear surface of the large metal substrate 12 is ground to the depth of cutting line T shown by a broken line so that the electrode separating resin 4a, which is injected in the electrode separating grooves 13a, is exposed to separate the pairs of electrodes 2a, 2b. In the grinding process, to prevent the semiconductor light-emitting elements 1, the reflectors 5, and the light-transmitting resins 6, which are mounted on the surface of the large metal substrate 12, from being damaged by grinding and polishing the rear surface of the large metal substrate 12, a large grinding protective sheet 18a is desirably adhered to the upper surfaces of the reflectors 5, and the large metal substrate 12 is desirably mounted on a grinding machine together with the large grinding protective sheet 18a.

The height of the light-transmitting resins 6 injected in the reflectors 5 is preferably slightly less than the height of the reflectors 5. This is to prevent an adhering surface of the large grinding protective sheet 18a from contacting the upper surfaces of the light-transmitting resins 6 when the large grinding protective sheet 18a is adhered to the upper surfaces of the reflectors 5 as illustrated in the production process (f) in FIG. 12. Since the upper surfaces of the light-transmitting resins 6 will not be contaminated, the optical property is prevented from deteriorating.

The production process (g) in FIG. 13 is a cutting and separating process. The large metal substrate 12 is cut into areas each including the semiconductor light-emitting element 1. In this embodiment, multiple semiconductor light-emitting devices 10 are mass produced as illustrated in the production process (h) by cutting the positions of cutting lines t shown by broken lines, that is, at the center of each metal substrate holding resin 4b. A process for adhering a large cutting protective sheet 18b to the rear surface of the large metal substrate 12 is provided before the cutting and separating process.

(Fourth Embodiment)

FIGS. 14 to 17 illustrate a mass production process of semiconductor light-emitting devices 20 according to a fourth embodiment of the present invention. This embodiment employs a collective substrate method that uses the large metal substrate 12 to mass produce the semiconductor light-emitting device 20 of the second embodiment.

The production method of this embodiment is basically the same as the production processes (a) to (g) of the semiconductor light-emitting device 20 described in FIGS. 7 and 8. The description for the production processes (a) to (c) illustrated in FIG. 7 is therefore omitted, and only the production process (d) illustrated in FIG. 7 and the production processes (e) to (g) illustrated in FIG. 8 will be described.

The production process (d) in FIG. 14 is a sealing resin injecting process. Since FIG. 14 illustrates the groove forming process to the sealing resin injecting process, those processes will be briefly described. First, the electrode separating grooves 13a and the metal substrate holding grooves 13b are formed in the large metal substrate 12 illustrated in FIG. 12. The electrode separating resin 14a is injected in the electrode separating grooves 13a, and the metal substrate holding resin 14b and the reflector forming resin 14c are injected in the metal substrate holding grooves 13b. The metal substrate holding resin 14b and the reflector forming resin 14c are combined as a whole. Subsequently, the semiconductor light-emitting elements 1 are flip-chip mounted on the element mounting positions 17 corresponding to the electrode separating grooves 13a of the large metal substrate 12.

Resin is injected in each metal substrate holding groove 13b of the large metal substrate 12. Part of the resin embedded in the metal substrate holding groove 13b is the metal substrate holding resin 14b. Part of the resin that projects on the surface of the large metal substrate 12 from the metal substrate holding groove 13b is the reflector forming resin 14c. The reflector forming resin 14c has an approximately trapezoidal cross-section having a lower base that is wider than the groove width of the metal substrate holding groove 13b. The reflector forming resin 14c has a height that is equivalent to the height of the reflector 5 of the semiconductor light-emitting device 10 according to the third embodiment and forms the reflector 25.

The production process (e) in FIG. 14 is a grinding process and corresponds to the production process (e) in FIG. 8 according to the second embodiment. The rear surface of the large metal substrate 12 is ground to the position of cutting line T shown by a broken line so that the electrode separating resin 14a, which is injected in the electrode separating grooves 13a, is exposed to electrically separate the pairs of electrodes 2a, 2b. In the grinding process, to prevent the semiconductor light-emitting elements 1, the reflectors 25, and the light-transmitting resins 6, which are mounted on the surface of the large metal substrate 12, from being damaged by grinding and polishing the rear surface of the large metal substrate 12, the large grinding protective sheet 18a is desirably adhered to the upper surfaces of the reflectors 25, and the large metal substrate 12 is desirably mounted on a grinding machine together with the large grinding protective sheet 18a. The height of the light-transmitting resins 6 is preferably slightly less than the height of the above-described reflectors 25.

The production process (f) in FIG. 15 is a cutting and separating process. The large metal substrate 12 is cut into areas each including the semiconductor light-emitting element 1. In this embodiment, multiple semiconductor light-emitting devices 20 are mass produced as illustrated in the production process (g) by cutting the large metal substrate 12 at the positions of cutting lines t shown by broken lines, that is, at the center of the upper surface of each reflector forming resin 14c. A process for adhering the large cutting protective sheet 18b to the rear surface of the large metal substrate 12 is provided before the cutting and separating process.

The method for producing the semiconductor light-emitting devices 20 according to this embodiment differs from the method for producing the semiconductor light-emitting devices 10 according to the third embodiment in that the reflectors 25 are formed simultaneously with the metal substrate holding resin 14b, and the reflectors 5 that come in separate members are unnecessary. That is, forming the reflectors 25 integrally with the metal substrate holding resin 14b at the same time eliminates the need for the separate reflectors 5 and also reduces the size. Simultaneously injecting the metal substrate holding resin 14b and the reflector forming resin 14c in the metal substrate holding groove 13b further reduces the number of the processes and thus reduces the production period and the production costs.

FIGS. 16 and 17 illustrate the semiconductor light-emitting devices 20, which have been separated by the cutting and separating process. FIG. 16 illustrates the individual semiconductor light-emitting devices 20. The individual semiconductor light-emitting devices 20 are obtained by cutting and separating the semiconductor light-emitting elements one by one. FIG. 17 illustrates a three-element semiconductor light-emitting device 20. The three-element semiconductor light-emitting device 20 is obtained by cutting and separating three semiconductor light-emitting elements as a single semiconductor light-emitting device. It is therefore possible to provide semiconductor light-emitting devices of various sizes desired by customers using the production method of the semiconductor light-emitting device that employs the collective substrate method of the present invention.

The production method of the semiconductor light-emitting device employing the collective substrate method of the present invention is advantageous in that, after the grinding process (f) of the third embodiment and the grinding process (e) of the fourth embodiment are completed, the optical property and the electrical property of the semiconductor light-emitting devices can be measured with the large cutting protective sheet 18b left adhered to the rear surface of the large metal substrate 12. The semiconductor light-emitting devices can be sorted depending on the properties through a batch process.

(Fifth Embodiment)

FIGS. 18 to 20 illustrate a semiconductor device 30 according to a fifth embodiment of the present invention. The semiconductor device according to this embodiment differs from the semiconductor light-emitting devices according to the aforementioned embodiments and is a power control semiconductor device. A metal substrate for a printed circuit board of the power control semiconductor device is the same as the metal substrate 2 used in the semiconductor light-emitting device of the first embodiment.

FIG. 18 is a flowchart illustrating a method for producing a power control semiconductor device 30. FIG. 19 is a plan view of the power control semiconductor device 30 made by the production method illustrated in FIG. 18 as viewed from the side of the metal substrate 2 on which the electrodes 2a are provided. FIG. 20 is a cross-sectional view of the power control semiconductor device 30 taken along the line A-A of FIG. 19. In this embodiment, a power control semiconductor element is a power control semiconductor element 31 in an 80-pin BGA package.

The production process (a) in FIG. 18 is a groove forming process and is based on the electrode specification for the power control semiconductor element 31. The electrode separating grooves 3 are formed in the metal substrate 2 by dicing at intervals of 0.4 mm to conform to the electrode pitch of 0.8 mm and the electrode size of 0.4 mm. The electrode separating grooves 3 have a width of 0.30 mm and a depth of 0.15 mm. In this embodiment, ten electrodes 2a are formed in one row. The metal substrate 2 is subjected to surface processing to improve mounting property for mounting the power control semiconductor element 31.

The production process (b) is an element mounting process. Lead-free solders are printed on the electrodes 2a of the metal substrate 2, and the power control semiconductor element 31 is placed on the printed lead-free solders. The lead-free solders are heated such that the electrodes 2a of the metal substrate 2 and electrodes 31a of the power control semiconductor element 31 are joined by soldering. Welding may be performed instead of soldering.

The production process (c) is a grinding process. The rear surface of the metal substrate 2 is ground and polished to the position of cutting line T shown by a broken line to separate the electrodes 2a. This process completes the power control semiconductor device 30.

The power control semiconductor device 30 made by the above-described production method has the electrodes 2a including 80 pins arranged in 8 rows and 10 columns on the rear surface as illustrated in FIGS. 19 and 20.

As described above, this embodiment allows individual radiators, which function also as the electrodes 31a, to be mounted on the power control semiconductor element 31, which includes many electrodes, and further improves heat dissipation using gaps between the electrodes 31a. Although omitted in this embodiment, a resin injecting process may be provided after the groove forming process, and an electrode separating resin may be applied to the electrode separating grooves 3.

As described above, with the pre-dicing process performed on the metal substrate, the present invention achieves the flatness of the metal substrate without any influence of distortion in the metal substrate that might otherwise be caused during production of the metal substrate or during mounting of the semiconductor element. This configuration allows the semiconductor element to be flip-chip mounted at low costs without providing bumps on the semiconductor element and the metal substrate. The flip-chip mounting provides high connection reliability. Furthermore, since the electrodes of the semiconductor device are arranged directly below the electrodes of the semiconductor element, the heat dissipation path is the shortest, and the metal substrate also serves as a heat sink. Thus, the semiconductor device that has high heat dissipation efficiency and high reliability is provided. Moreover, injecting resin in the grooves formed in the metal substrate reduces grinding burrs that might otherwise be caused when grinding the grooves from the rear surface of the metal substrate.

In addition, when the reflectors are mounted, the resin that projects from the reference holes and the metal substrate serves as a position guide in mounting of the reflectors. This configuration improves the position accuracy. Since mounting of the reflectors is performed by a batch process, the production period and the production costs are advantageously reduced. Forming the reflectors on the metal substrate holding grooves (semiconductor device separating grooves) further reduces the size of the semiconductor device. As described above, the present invention provides a semiconductor device that improves the yield and the connection reliability and has good mass productivity and superior heat dissipation efficiency.

INDUSTRIAL APPLICABILITY

Examples of the present invention include semiconductor light-emitting devices mainly used for lighting, backlight sources of liquid crystal displays, and flush light sources of cameras. The present invention is not limited to the semiconductor light-emitting device, but is applicable to mounting of any semiconductor element on a metal substrate. In particular, with superior heat dissipation efficiency, the present invention is most suitable for application in power control semiconductor devices.

DESCRIPTION OF THE REFERENCE NUMERAL 1 semiconductor light-emitting element (semiconductor element)
2 metal substrate
2a, 2b electrode
3, 3a, 13a electrode separating groove
3b, 13b metal substrate holding groove
4a, 14a electrode separating resin
4b, 14b metal substrate holding resin
4c, 14c reflector forming resin
5, 25 reflector
6 light-transmitting resin
7, 17 element mounting position
8a grinding protective sheet
8b cutting protective sheet
18a large grinding protective sheet
18b large cutting protective sheet
10, 20 semiconductor light-emitting device (semiconductor device)
12 large metal substrate
12a, 22a reference hole
12b alignment hole
22 large reflector substrate
22b connecting portion
30 power control semiconductor device
31 power control semiconductor element 31a electrode
S configuration area
T, t cutting line

The invention claimed is:

1. A method for producing a semiconductor device, the semiconductor device comprising:
a metal substrate; and
a semiconductor element configured to be mounted on the metal substrate,
the method comprising:
forming an electrode separating groove in an element mounting position on a main surface of the metal substrate;
forming a metal substrate holding groove around the element mounting position;
injecting an electrode separating resin in the electrode separating groove;
injecting a metal substrate holding resin in the metal substrate holding groove;
flip-chip mounting the semiconductor element to extend over the electrode separating groove; and
grinding the metal substrate from a surface of the metal substrate opposite to the main surface of the metal substrate up to a position reaching the electrode separating groove and the metal substrate holding groove.

2. The method for producing a semiconductor device according to claim 1, further comprising forming a reflector around the semiconductor element, which is flip-chip mounted on the element mounting position on the main surface of the metal substrate.

3. The method for producing a semiconductor device according to claim 2, wherein the forming of the reflector comprises forming the reflector with the metal substrate holding resin, which is injected in the metal substrate holding groove formed around the element mounting position.

4. The method for producing a semiconductor device according to claim 2, further comprising injecting a light-transmitting resin in the reflector to seal the semiconductor element.

5. A semiconductor device comprising being manufactured by the production method according to claim 1.

6. The method for producing a semiconductor device according to claim 3, further comprising injecting a light-transmitting resin into the reflector to seal the reflector.

7. A method for producing semiconductor devices, each of the semiconductor devices comprising:
a metal substrate; and
a semiconductor element configured to be mounted on the metal substrate,
the method comprising:
forming electrode separating grooves in a plurality of element mounting positions on a main surface of a large metal substrate;
forming metal substrate holding grooves around the plurality of element mounting positions;
injecting an electrode separating resin in the electrode separating grooves;
injecting a metal substrate holding resin in the metal substrate holding grooves;
flip-chip mounting semiconductor elements, each extending over an associated one of the electrode separating grooves;
grinding the large metal substrate from a surface of the metal substrate opposite to the main surface of the large metal substrate up to a position reaching the electrode separating grooves and the metal substrate holding grooves; and
cutting the large metal substrate at a center of the metal substrate holding resin injected in each of the metal substrate holding grooves to separate the large metal substrate into semiconductor devices.

8. The method for producing semiconductor devices according to claim 7, further comprising forming reflectors around the semiconductor elements, which are flip-chip mounted on the element mounting positions on the main surface of the large metal substrate.

9. The method for producing semiconductor devices according to claim 8, wherein the forming of the reflectors comprises stacking a large reflector substrate comprising a plurality of reflectors corresponding to the element mounting positions on the main surface of the large metal substrate.

10. The method for producing semiconductor devices according to claim 8, wherein the forming of the reflectors comprises forming the reflectors with the metal substrate holding resin, which is injected in the metal substrate holding grooves formed around the element mounting positions.

11. The method for producing semiconductor devices according to claim 8, further comprising injecting a light-transmitting resin in the reflectors to seal the semiconductor elements.

12. The method for producing semiconductor devices according to claim 7, further comprising adhering a grinding protective sheet to a surface of the semiconductor elements on the main surface of the large metal substrate prior to the grinding of the metal substrate.

13. The method for producing semiconductor devices according to claim 7, wherein the cutting of the large metal substrate comprises cutting the large metal substrate at predetermined positions of the metal substrate holding resin injected in the metal holding grooves formed around the element mounting positions.

14. The method for producing semiconductor devices according to claim 7, further comprising adhering a cutting protective sheet on a rear surface of the large metal substrate prior to the cutting of the large metal substrate.

15. A semiconductor device comprising a plurality of semiconductor elements produced by the production method according to claim 7.

16. The method for producing semiconductor devices according to claim 9, further comprising injecting a light-transmitting resin in the reflectors to seal the semiconductor elements.

17. The method for producing semiconductor devices according to claim 10, further comprising injecting a light-transmitting resin in the reflectors to seal the semiconductor elements.

18. The method for producing semiconductor devices according to claim 7, wherein the injecting of the metal substrate holding resin comprises projecting the metal substrate holding resin injected in the metal substrate holding grooves from the main surface of the large metal substrate.

* * * * *